United States Patent
Boozer et al.

(10) Patent No.: US 10,327,326 B2
(45) Date of Patent: Jun. 18, 2019

(54) ELECTRONIC DEVICE WITH ENCAPSULATED CIRCUIT ASSEMBLY HAVING AN INTEGRATED METAL LAYER

(71) Applicant: Apple Inc., Cupertino, CA (US)

(72) Inventors: Brad G. Boozer, Saratoga, CA (US);
Colin M. Ely, Sunnyvale, CA (US);
Steven P. Cardinali, Campbell, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/819,243

(22) Filed: Nov. 21, 2017

(65) Prior Publication Data

US 2019/0059152 A1 Feb. 21, 2019

Related U.S. Application Data

(60) Provisional application No. 62/546,875, filed on Aug. 17, 2017.

(51) Int. Cl.
*H05K 1/00* (2006.01)
*H05K 1/02* (2006.01)
(Continued)

(52) U.S. Cl.
CPC ......... *H05K 1/0216* (2013.01); *H03K 17/962* (2013.01); *H05K 1/028* (2013.01);
(Continued)

(58) Field of Classification Search
CPC . A44B 11/2584; A44C 5/0015; A44C 5/2052;
A44C 5/2071; B32B 2457/20; B32B 2457/202; B32B 2457/206; B32B 2457/208; G06F 1/163; G06F 3/014; G06F 3/047; G09G 2300/04; G09G 5/003; H03K 17/962; H05K 1/0216; H05K 1/028;
(Continued)

(56) References Cited

U.S. PATENT DOCUMENTS 2,471,869 A 5/1949 Gebel
3,676,814 A 7/1972 Trunzo et al.
(Continued)

FOREIGN PATENT DOCUMENTS

CN 102611215 7/2012
CN 102741954 10/2012
(Continued)

*Primary Examiner* — Yuriy Semenenko
(74) *Attorney, Agent, or Firm* — Kilpatrick Townsend and Stockton, LLP

(57) ABSTRACT

Embodiments are directed to a circuit assembly for an electronic device having an electromagnetic shield that defines a sensing element or contact pad along an outer surface of the assembly. The circuit assembly includes a group of electrical components attached to a surface of a printed circuit board. A molded structure may encapsulate the group of electrical components and at least a portion of the surface of the printed circuit board. A metal layer may be formed over an outer surface of the molded structure. The metal layer may define both a shield portion configured to provide shielding for one or more of the group of electrical components and an electrode configured to detect an input applied to the electronic device.

20 Claims, 14 Drawing Sheets

(51) Int. Cl.
- *H05K 1/18* (2006.01)
- *H03K 17/96* (2006.01)
- *H05K 5/00* (2006.01)
- *H05K 3/28* (2006.01)
- *H05K 5/06* (2006.01)
- *H05K 9/00* (2006.01)

(52) U.S. Cl.
CPC ............ *H05K 1/185* (2013.01); *H05K 3/284* (2013.01); *H05K 5/0017* (2013.01); *H05K 5/0086* (2013.01); *H05K 5/064* (2013.01); *H05K 9/0026* (2013.01)

(58) Field of Classification Search
CPC ...... H05K 1/185; H05K 3/284; H05K 5/0017; H05K 5/0086
See application file for complete search history.

(56) References Cited

U.S. PATENT DOCUMENTS

| | | |
|---|---|---|
| 4,908,347 A | 3/1990 | Denk |
| 5,708,362 A | 1/1998 | Frese et al. |
| 5,872,500 A | 2/1999 | Gore |
| 5,903,134 A | 5/1999 | Takeuchi |
| 5,931,764 A | 8/1999 | Freeman et al. |
| 5,979,087 A | 11/1999 | Bell et al. |
| 6,667,435 B1 | 12/2003 | French et al. |
| 7,477,039 B2 | 1/2009 | Rodarte |
| 7,538,977 B2 | 5/2009 | Gider et al. |
| 7,710,071 B2 | 5/2010 | Elizalde Rodarte |
| 7,948,208 B2 | 5/2011 | Partovi et al. |
| 7,952,322 B2 | 5/2011 | Partovi et al. |
| 8,169,185 B2 | 5/2012 | Partovi et al. |
| 8,248,025 B2 | 8/2012 | Sip |
| 8,497,657 B2 | 7/2013 | Franks et al. |
| 8,629,652 B2 | 1/2014 | Partovi et al. |
| 8,629,654 B2 | 1/2014 | Partovi et al. |
| 8,704,628 B2 | 4/2014 | Kook |
| 8,823,238 B2 | 9/2014 | Greaves et al. |
| 8,890,470 B2 | 11/2014 | Partovi |
| 8,896,264 B2 | 11/2014 | Partovi |
| 8,901,775 B2 | 12/2014 | Armstrong et al. |
| 8,901,881 B2 | 12/2014 | Partovi |
| 8,922,162 B2 | 12/2014 | Park et al. |
| 8,947,047 B2 | 2/2015 | Partovi et al. |
| 9,106,083 B2 | 8/2015 | Partovi |
| 9,112,362 B2 | 8/2015 | Partovi |
| 9,112,363 B2 | 8/2015 | Partovi |
| 9,112,364 B2 | 8/2015 | Partovi |
| 9,178,369 B2 | 11/2015 | Partovi |
| 9,240,270 B2 | 1/2016 | Wu et al. |
| 9,563,233 B2 | 2/2017 | McCormack et al. |
| 2011/0050164 A1 | 3/2011 | Partovi et al. |
| 2011/0221385 A1 | 9/2011 | Partovi et al. |
| 2013/0049484 A1 | 2/2013 | Weissentern |
| 2013/0093388 A1 | 4/2013 | Partovi |
| 2013/0099563 A1 | 4/2013 | Partovi et al. |
| 2013/0249479 A1 | 9/2013 | Partovi |
| 2013/0260677 A1 | 10/2013 | Partovi |
| 2013/0271069 A1 | 10/2013 | Partovi |
| 2013/0285604 A1 | 10/2013 | Partovi |
| 2013/0285605 A1 | 10/2013 | Partovi |
| 2013/0300204 A1 | 11/2013 | Partovi |
| 2014/0103873 A1 | 4/2014 | Partovi et al. |
| 2014/0132210 A1 | 5/2014 | Partovi |
| 2014/0191568 A1 | 7/2014 | Partovi |
| 2014/0293144 A1* | 10/2014 | Bae .............. G06F 3/041 349/12 |
| 2014/0306654 A1 | 10/2014 | Partovi |
| 2015/0130412 A1 | 5/2015 | Partovi |
| 2015/0145475 A1 | 5/2015 | Partovi et al. |
| 2015/0270058 A1 | 9/2015 | Golko et al. |
| 2015/0341476 A1 | 11/2015 | Hogue et al. |
| 2015/0346877 A1 | 12/2015 | Justice et al. |
| 2015/0371768 A1 | 12/2015 | Graham et al. |
| 2016/0006288 A1 | 1/2016 | Wagman et al. |
| 2016/0064141 A1 | 3/2016 | Graham et al. |
| 2016/0135516 A1* | 5/2016 | Cobbett ............ A61B 5/0205 2/170 |
| 2017/0295679 A1* | 10/2017 | Kim .............. B29C 45/14639 |
| 2017/0300166 A1* | 10/2017 | Rosenberg .......... G06F 3/045 |
| 2017/0324160 A1* | 11/2017 | Khoury ............ H01Q 1/526 |

FOREIGN PATENT DOCUMENTS

| | | |
|---|---|---|
| CN | 102952474 | 3/2013 |
| CN | 203381512 | 1/2014 |
| CN | 203434644 | 2/2014 |
| CN | 203466005 | 3/2014 |
| EP | 1511370 | 3/2007 |
| EP | 1790196 | 7/2012 |
| EP | 2535906 | 12/2012 |
| JP | 2012199370 | 10/2012 |
| JP | 2012222926 | 11/2012 |
| WO | WO03/081976 | 10/2003 |
| WO | WO2009/105615 | 8/2009 |
| WO | WO2012/152980 | 11/2012 |
| WO | WO2013/035282 | 3/2013 |
| WO | WO2014/036558 | 3/2014 |

* cited by examiner

ELECTRONIC DEVICE WITH ENCAPSULATED CIRCUIT ASSEMBLY HAVING AN INTEGRATED METAL LAYER

CROSS-REFERENCE TO RELATED APPLICATION(S)

This application is a nonprovisional patent application of and claims the benefit of U.S. Provisional Patent Application No. 62/546,875, filed Aug. 17, 2017 and titled "Electronic Device with Encapsulated Circuit Assembly Having an Integrated Metal Layer," the disclosure of which is hereby incorporated herein by reference in its entirety.

BACKGROUND

Due to the space constraints in many modern day electronic devices, it may be necessary or beneficial to shield a group of electronic components from another group of components or from external interference or sources of noise. However, layout and packaging constraints of some compact electronic devices may make it difficult to shield some electronic components. Thus, there is a need for systems and techniques that can be used to integrate electromagnetic shields and other conductive elements with the other electronic components to reduce the size of the electronic device without limiting the functionality or reducing the durability components or the device.

SUMMARY

Embodiments of the present invention are directed to a circuit assembly having an electromagnetic shield with an integrated contact pad or electrode. In some embodiments, the circuit assembly is encapsulated in a molded structure that protects the electronic components of the circuit assembly. A metal layer may be formed over the molded structure and may serve as a shield, contact pad, or electrode for the electronic device.

In a first aspect, the present disclosure includes a circuit assembly for an electronic device. The circuit assembly includes a printed circuit board. The circuit assembly further includes a group of electrical components attached to a surface of the printed circuit board. The circuit assembly further includes a molded structure encapsulating the group of electrical components and at least a portion of the surface of the printed circuit board. The circuit assembly further includes a metal layer formed over an outer surface of the molded structure and defining a shield portion configured to provide shielding for one or more of the group of electrical components. The metal layer may further define an electrode configured to detect an input applied to the electronic device.

In a second aspect, the present invention includes a wearable electronic device. The wearable electronic device include an enclosure. The wearable electronic device further includes a circuit assembly positioned within the enclosure. The circuit assembly further includes a printed circuit board. The circuit assembly may further includes a group of electrical components attached and electrically coupled to the printed circuit board. The circuit assembly further includes a molded structure encapsulating the group of electrical components. The circuit assembly further includes a metal layer formed over the molded structure and defining an electromagnetic shield for one or more electrical components of the group of electrical components. The metal layer may further define an electrode configured to electrically couple to an electrical component of the wearable electronic device that is distinct from the circuit assembly.

In a third aspect, the present invention includes a method of forming a circuit assembly. The method includes forming a molded structure over a group of electrical components positioned along a printed circuit board to encapsulate the group of electrical components within the molded structure. The method further includes forming a metal layer along an outer surface of the molded structure to define an electrode electrically coupled to the group of electrical components. Forming the metal layer may also define a shield portion configured to shield the group of electrical components from electromagnetic interference.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like elements.

Figure 1:
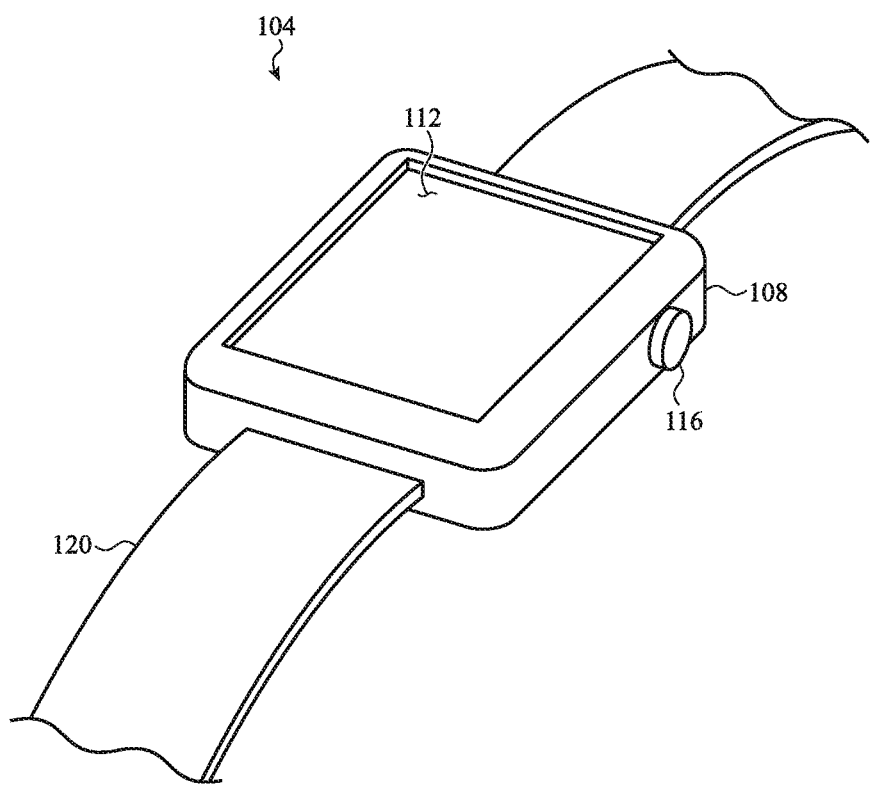
FIG. 1 depicts an example electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalties of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to circuit assemblies for an electronic device and, more particularly, to a circuit assembly having a molded layer encapsulating electronic components of the circuit assembly. The molded layer may provide a moisture barrier and protect the electronic components from contamination or corrosion. The circuit assembly also has a metal layer formed over the molded layer that defines both an electromagnetic shield and one or more electrodes. The electromagnetic shield or shield portion may inhibit propagation of electromagnetic signals into or from the electronic components of the circuit assembly. The electrode may be electrically coupled with one or more of a group of electrical components of the circuit assembly, which may be partially or fully encapsulated in a molded structure of the circuit assembly. In some cases, the electrode may form, or be a component of, a sensing element of the circuit assembly, such as a capacitive sensor, optical sensor, strain gauge, or the like. The electrode may also form a contact pad, terminal, or other conductive element used to facilitate an electrical connection with a separate element that is distinct from the circuit assembly, such as other components or assemblies of an electronic device. By forming the shield portion and the electrode with a metal layer positioned over the molded structure, the size and packaging of various components of the electronic device may be optimized, while enhancing the adaptability and functionality of the circuit assembly within the electronic device.

Broadly, the circuit assembly may include various electrical components arranged along a printed circuit board (PCB), electrical substrate, and/or other structure electrically coupling the electrical components. For example, the electrical components may be processing units, controllers, and/or other integrated circuits used to control various aspects of an electronic device. The circuit assembly may also include electrical components that perform various communication functions including, for example, wireless transceivers, antennas, and specialized communication integrated circuits. In this regard, the electrical components may be configured to cooperate with other components or assemblies of an electronic device, including sensors, switches, processing units or the like. The electrical components may be susceptible, in some cases, to moisture, contaminates, electromagnetic interference and/or other factors, and thus may be vulnerable when exposed.

The molded structure of the circuit assembly may be formed or molded over some or all of the electrical components (and associated region of the printed circuit board) to form a protective barrier that protects the electrical components from moisture or other potential contaminates. The molded structure may also provide a structural support for the electrical components and/or allow the electrical components to be more tightly spaced along the substrate. The molded structure may be formed from an injection moldable plastic or other suitable polymer; however, other materials are contemplated including ceramic and composite materials. In some cases, the molded layer may include a plastic doped with a metal material that may be used to form metal traces along the molded structure, as described herein, for example, using a laser direct structuring (LDS) technique.

The metal layer of the circuit assembly may be formed over the molded structure (and associated group of electrical components) and mitigate electromagnetic interference while forming an electrical contact or sensing element for the circuit assembly. In particular, the shield portion, formed along the surface of the molded structure, may be electrically isolated from the electrical components and substantially interrupt electromagnetic signals propagating into and out of the circuit assembly. The electrode, formed along the same or common surface of the molded structure as the shield portion, may be electrically coupled with one or more of the electrical components, for example, via an electrically conductive path between the electrode and the substrate (e.g., using conductive vias, flexible circuits, or the like). This may allow the electrode to facilitate a connection between one or more of the electrical components and another assembly or component of the electronic device and/or define a sensing element along an outer surface of the molded structure. In some cases, the electrode may be electrically coupled to the electrical substrate (e.g., the printed circuit board) without being coupled to one or more of the electrical components of the circuit assembly. For example, electrical signals from the electrode may be passed through the electrical substrate to a separate and/or distinct component without passing through or being connected to one or more of the electrical components of the circuit assembly.

To facilitate the foregoing, the shield portion and the electrode may be separated from one another along the surface of the molded structure. In particular, the metal layer may define a void, space, or gap between the shield portion and the electrode. This may electrically isolate the shield portion and the electrode from one another such that the shield portion inhibits electromagnetic signals while the electrode is electrically coupled with the electrical components of the circuit assembly. In some cases, the void may be filled with a dialectic material. A size of the void or the gap may be manipulated to control the inhibition of the electromagnetic signals by the metal layer. This may be beneficial, for example, where the circuit assembly is positioned proximate an auxiliary component of an electronic device (such as an antenna) that may be sensitive to electromagnetic signals emanating from the circuit assembly. The size of the void or the gap may also be manipulated to accommodate electrical traces, terminals, hot bars, and/or other components used to connect multiple different electrodes with one another and/or another component or assembly of the electronic device.

The metal layer may be formed from any appropriate electrically conductive material using a variety of techniques. As one possibility, the metal layer may be formed along and/or on an outer surface of the molded structure using a sputter deposition or other physical vapor deposition technique, as described herein, although other techniques are possible. The sputtering, deposition, and/or other technique may be selectively controlled so that the metal layer defines the shield portion, electrode(s), and/or void or gaps of appropriate size. As such, the metal layer may be formed over the molded structure and define the corresponding shapes and features. This may be facilitated by use of a masking layer; however, in some cases, a masking layer may not be required. Additionally or alternatively, the metal layer may be formed over the molded structure as a substantially uniform or continuous layer. Etching, or other removal process, may subsequently be employed to form the voids or gaps in the metal layer, thereby defining the resulting shield portion and electrode.

The circuit assembly may be used with a variety of electronic devices, including wearable electronic devices, such as a watch. Accordingly, the electrode may be used to form, or be a component of, various sensing elements, as may be appropriate for a particular application. To illustrate, in an embodiment where the electronic device is a watch, the electronic device may include a touch sensitive display having a graphical output. The circuit assembly may be arranged within a watch body or enclosure such that the electrode is capacitively coupled with a sensing layer or element or the touch sensitive display. The circuit assembly may thus detect a change in capacitance caused or induced by an input received along the touch sensitive display, which may allow the graphical output to be modified based on the received input. As another example, the electronic device may include a band coupled with the enclosure and configured to secure the watch to a user. The circuit assembly may be arranged within the enclosure to detect a position of the user relative to the watch band, for example, which may be used to control or inform one or more functions of the electronic device. For example, the graphical output of the touch sensitive display may be manipulated in a specified manner when the user is wearing the watch.

It will be appreciated that the foregoing example sensing elements are presented for purposes of illustration only. Other sensing elements and configurations are contemplated and discussed herein, including using the electrode to define, or form a component or element of, an antenna of an electronic device. The antenna of the electronic device need not be formed on or with the circuit assembly. In other cases, the electrode provides an electrical terminal or contact pad that may be used to connect the circuit assembly with an auxiliary component of the electronic device, such as an antenna arranged within a device enclosure external to, or separated from, the circuit assembly. More generally, the electrode may form a terminal, connection node, or otherwise also be used to connect the circuit assembly to other types or auxiliary components with the electronic device, including charging assemblies, other sensors, processing units, and so on. Further, the electronic device is not limited to wearable electronic devices. The circuit assembly may be used in substantially any appropriate electronic device including smart phones and notebook computers, among other appropriate devices.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1 depicts an electronic device 104. The electronic device 104 includes a circuit assembly (e.g., circuit assembly 124 of FIG. 2), such as the circuit assembly generally discussed above and described in greater detail below. The circuit assembly may include a metal layer that forms an electromagnetic shield and also defines an electrode or contact of the circuit assembly.

In a non-limiting example, as shown in FIG. 1, the electronic device 104 may be a wearable electronic device, such as a smart watch. The electronic device 104 may include an enclosure 108 that defines a watch body. The enclosure 108 may define various openings configured to receive or partially receive components of the watch. As shown in FIG. 1, the electronic device 104 may include a display 112 at least partially positioned within a first opening of the enclosure 108 defined along a top surface. The display 112 may be a touch sensitive display configured to depict a graphical output of the electronic device 104 (e.g., including indicia, symbols, text, icons, notifications, and so on). The electronic device may also include a crown 116 at least partially positioned within a second opening of the enclosure 108 defined along a side surface. The crown 116 may be configured to receive a translational and rotational input that are used to control a function of the electronic device 104. For example, the graphical output of the display 112 may be modified in a first manner in response to translation input at the crown 116 and the graphical output of the display 112 may be modified in a second manner in response to rotational input at the crown 116. The electronic device 104 may also include a band 120. The band 120 may be coupled along an exterior surface of the enclosure 108 and configured to secure the electronic device 104 to a user.

It should be noted that the electronic device 104 may also include various other components, such as one or more ports (e.g., charging ports, data transfer ports, or the like), additional input/output buttons, and so on. Further, it is understood that the electronic device 104 may be any suitable device having a circuit assembly, as described herein. Other example electronic devices include notebook computers, desktop computers, smart phones, tablets, portable media players, other watches, pencils, and/or other appropriate electronic devices, including other wearable devices. Other examples of electronic devices may include health monitoring devices, digital cameras, printers, scanners, security systems or devices, or electronics for automobiles, building, structures, among other electronic devices. As such, the discussion of any electronic device, such as electronic device 104, is meant as illustrative only.

Figure 2:
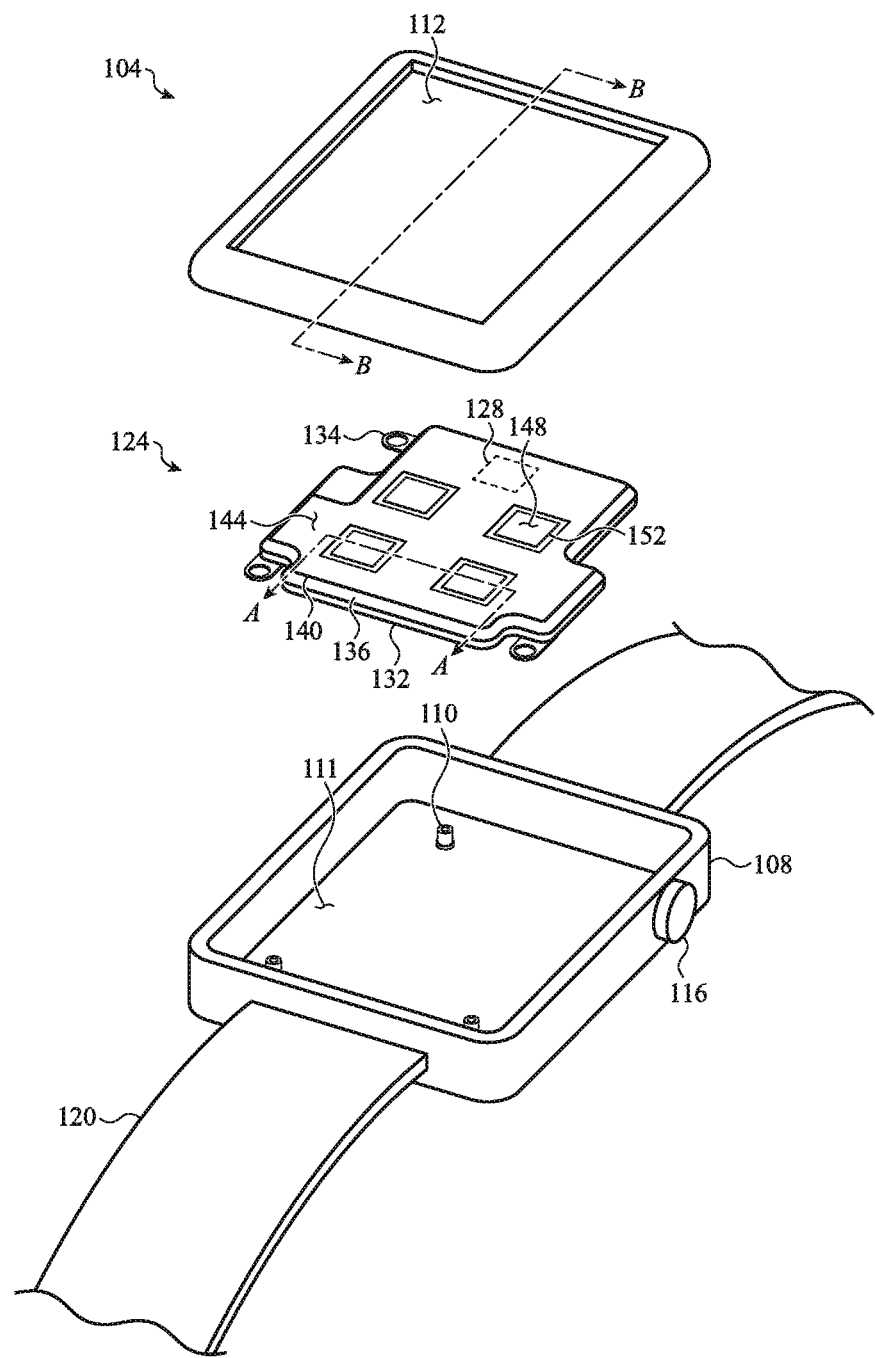
FIG. 2 depicts an exploded view of the example electronic device of FIG. 1 having a circuit assembly.

FIG. 2 depicts an exploded view of the electronic device 104. As shown in FIG. 2, the electronic device 104 includes a circuit assembly 124. The circuit assembly 124 may be operatively coupled to various components of the electronic device 104 and may function as a main logic board or main controller for the electronic device 104. In the present example, the circuit assembly 124 may be operatively coupled to the display 112. The circuit assembly 124 may also be operatively coupled to an internal power source (such as a battery) and/or charging assembly. The circuit assembly 124 may also be operatively coupled to various other components and assemblies of the electronic device 104, including various sensors, antennas, processing units, speakers, buttons, microphones, biosensors, light sources, cameras, and so on, as described in greater detail below. While FIG. 2 depicts the electronic device 104 as having a single circuit assembly (e.g., circuit assembly 124), some implementations may include multiple circuit assemblies that are interconnected with each other and with other various components of the electronic device 104.

The circuit assembly 124 may include various electrical components that are used to control a function of the electronic device 104 and/or perform various communication functions. This may include, without limitations, processing units, controllers, integrated circuits, antennas, wireless transceivers, and so on, including various combinations thereof. For example, the circuit assembly 124 may include a group of electrical components 128 (shown in phantom). The group of electrical components 128 may be electrically coupled with one another within the circuit assembly 124 and be responsive to input applied to the electronic device 104, as described herein. Rather than remain exposed within an interior volume of the enclosure 108, the group of electrical components 128 may be encapsulated with one or more layers of the circuit assembly, including various molding, insulating, and/or electromagnetic shielding layers, as may be appropriate for a given application. For example, the group of electrical components 128 may be susceptible to various environmental and design considerations including moisture, dust, debris, contaminants, electromagnetic interference, sizing constrains, and so on; the various layers of the circuit assembly 124 may function to mitigate these considerations.

In the embodiment of FIG. 2, the group of electrical components 128 may be arranged along a surface of a substrate 132. The substrate 132 may be a printed circuit board, electrical substrate, and/or other appropriate mounting surface for the group of electrical components 128. For example, the substrate 132 may be a printed circuit board formed from a substantially rigid and optionally planar structure having features that engage (and electrically couple) the group of electrical components 128 and the substrate 132 to one another. As such, the substrate 132 may include electrical traces that contact the group of electrical components 128 and electrically couple the group of electrical components 128 to the substrate 132. The substrate 132 may be constructed from a variety of materials, including plastics, composites, synthetics, and so on, including materials that may be translucent or otherwise allow light to propagate therethrough.

The substrate 132 may be configured for attachment along an interior surface of the enclosure 108. For example, the substrate 132 may include engagement features 134. The engagement features 134 may be protrusions, eyelets, threaded features, and/or other structures (which may or may not include an opening) that are configured to secure the substrate 132 within the enclosure 108. In the embodiment of FIG. 2, the engagement features 134 are shown extending away from a major surface of the substrate 132; however, in other embodiments, the engagement features may extend in other directions, including extending directly toward a bottom and/or top interior surface of the enclosure 108.

To facilitate the foregoing, the enclosure 108 may include retention features 110 positioned along an interior surface 111. The retention features 110 may be bosses, pins, studs and/or a variety of other features that cooperate with the engagement features 134 of the circuit assembly 124 to secure the circuit assembly 124 within the enclosure 108. In the embodiment of FIG. 2, the retention features 110 may be bosses that are received by openings in the engagement features 134 of the circuit assembly 124. In some cases, the retention features 110 and the engagement features 134 may be or have corresponding threaded features that are used to secure the circuit assembly 124 (optionally removeable) along the interior surface 111 of the enclosure 108. Further, while the retention features 110 are shown along the interior surface 111 forming a bottom interior surface of the enclosure 108, it will be appreciated that the retention features 110 may be positioned along substantially any interior surface of the enclosure 108. For example, the retention features 110 may additionally or alternatively be positioned along interior sidewalls and/or interior top surfaces of the enclosure 108, which may facilitate arranging the circuit assembly 124 in various configurations within the enclosure 108 (e.g., such as arranging the circuit assembly 124 proximate the display 112, as described with respect to FIG. 4B).

The group of electrical components 128 and the substrate 132 may be partially or fully encapsulated within a molded structure. As shown in FIG. 2, the circuit assembly 124 may include a molded structure 136 formed or molded over some or all of the group of electrical components 128 and the substrate 132. The molded structure 136 may form a protective barrier over the group of electrical components 128 and the substrate 132 that inhibits moisture, debris, and other potential contaminants from reaching the group of electrical components 128 and/or other components or assemblies of the circuit assembly 124. The molded structure 136 may also be a substantially rigid structure (when hardened) that provides structural support for the group of electrical components 128 within the circuit assembly 124. This may allow the circuit assembly 124 to include multiple, tightly packing electrical components along the surface of the substrate 132. This may be beneficial, for example, in the context of a portable and/or wearable electronic device, in which design and packaging constraints may limit the available footprint for the circuit assembly 124 within the electronic device 104. The molded structure 136 may also help reduce the risk of damage caused by a physical impact or other form of mechanical shock.

As shown in FIG. 2, the molded structure 136 may be formed completely over the group of electrical components 128 and the substrate 132; however, this is not required. In some cases, the molded structure 136 may be formed over selected regions of the electrical component 138 and/or the substrate 132. For example, the molded structure 136 may cover a center region of the circuit assembly 124 (encapsulating the group of electrical components 128), while a periphery of the substrate 132 may remain exposed. This may facilitate physically attaching the substrate 132 to the enclosure 108. In other cases, only a portion of the group of electrical components 128 may be covered by the molded structure 136. Further, in cases where the circuit assembly 124 includes multiple electrical components, a subset of the electrical components may be encapsulated (or partially encapsulated) while others remain exposed on the substrate 132.

The circuit assembly 124 shows the molded structure 136 covering or encapsulating a top surface of the substrate 132. Other embodiments are contemplated, however, in which the molded structure 136 additionally or alternatively encapsulates or covers a side and/or bottom surface of the substrate 132 (e.g., as described with respect to FIG. 3D). Further, as explained in greater detail below, while the embodiment of FIG. 2 shows the top surface of the substrate 132 (and associated portions of the molded structure 136) positioned proximate the display 112, the circuit assembly 124 may be arranged in substantially any appropriate configuration with the enclosure 108, including configurations in which the top surface of the substrate 132 (and associated portions of the molded structure 136) are positioned proximate the interior surface 111. Accordingly, the circuit assembly 124 may be arranged such that the molded structure 136 is positioned proximate to or extend along any appropriate surface or component of the electronic device 104.

The molded structure 136 may be formed from a variety of moldable or castable materials, including plastics, resins, ceramics, composites, and so on. Accordingly, the molded structure 136 may be formed by flowing a substantially liquefied or viscous material over one or more surfaces of the circuit assembly 124. For example, material may be introduced into a form containing the group of electrical components 128 and/or the substrate 132 and caused to harden or solidify around one or more surfaces of the group of electrical components 128 and/or the substrate 132. This may allow the molded structure 136 to encapsulate the group of electrical components 128 on the surface of the substrate 132. Such techniques may also allow the molded structure 136 to be positioned within narrow regions, gaps, spaces, or the like of the circuit assembly 124 (e.g., such as between a narrow passage between electrical components positioned along the substrate 132), thereby facilitating use of the molded structure 136 as a structural component of the circuit assembly 124, particularly along complex or irregular geometries of the circuit assembly 124.

The molded structure 136 may, in some cases, be formed form a dielectric material to prevent or reduce electrical conduction between the electronic components 128. In some instances, the molded structure 136 may also be configured to form part or all of the metal layer of the circuit assembly 124. For example, the molded structure 136 may be formed from a plastic doped with a metal material. The metal-doped plastic material may be substantially any plastic material having a relatively small amount of metallic material added to the plastic material. The metallic material may be activated by a laser directed along a surface of the metal-doped plastic material to form the metal layer. The metal layer may include a shield portion, one or more electrodes and/or a metalized or conductive path along a surface of the material. In some instances, this technique may be used to create electrical traces along the surface of the molded structure 136, as described in greater detail below with respect to FIG. 5A. For example, the electrical traces may be formed on an outer surface of the molded structure 136 from a portion of the metal material remaining after a portion of the plastic material has been ablated. Additionally or alternatively, such techniques may also be used to define an electromagnetic shield, contact pad, sensing element, or other feature of the circuit assembly 124.

The circuit assembly 124 may be configured to inhibit the propagation of electromagnetic signals within the electronic device 104. For example, the circuit assembly 124 may include an electromagnetic shield formed partially or fully around the group of electrical components 128, the substrate 132, and/or the molded structure 136 that may block or limit electromagnetic signals or other radiation from entering or exiting the circuit assembly. The electromagnetic shield may also be tailored or tuned to limit electromagnetic interference to a specified level, which may be beneficial for auxiliary components of the electronic device 104 (separate from the circuit assembly 124), such as an antenna, sensor, processing unit, and so on that operate optimally at the specified level of interference, as described herein. Further, the electromagnetic shield includes an electrode (e.g., integrated contact pad or sensing element) of the circuit assembly 124. This may allow the circuit assembly 124 to be both electromagnetically shielded (to various degrees) and have a contact pad or sensing element positioned along an outer surface of the circuit assembly 124, such as an outer surface of the molded structure 136.

To facilitate the foregoing, the circuit assembly 124 includes a metal layer 140. The metal layer 140 may be an electrically conductive layer formed around the molded structure 136. The metal layer 140 may be separated from the group of electrical components 128 and the substrate 132 by the molded structure 136. A portion of the metal layer 140 may be electrically isolated from the group of electrical components 128 and the substrate 132 and form the electromagnetic shield, while another portion of the metal layer 140 may be electrically coupled to a group of electrical components 128 and the substrate 132 and form the electrode.

Accordingly, the metal layer 140 may define a shield portion 144 and one or more electrodes, such as electrode 148 shown in FIG. 2. The shield portion 144 and the electrode 148 may be formed or positioned along a common surface of the molded structure 136 and separated from one another by a void or gap within the metal layer 140. As shown in FIG. 2, the shield portion 144 and the electrode 148 are separated from one another by a void 152. The void 152 (also referred to herein as a space or gap) may electrically isolate the shield portion 144 and the electrode 148. In some cases, the void 152 may be filled with a dialectic material and/or include or be positioned along electrical traces of the circuit assembly 124, for example, as described with respect to FIG. 5A.

The shield portion 144 of the metal layer 140 may be tuned to limit electromagnetic signal interference within the circuit assembly 124 and more generally within the electronic device 104. For example, the shield portion 144 may be constructed according to various material and/or geometric parameters that may control the reflection and absorption of energy across the metal layer. Such parameters may include, without limitation, the thickness, conductivity, and the continuity of the shield portion 144. Accordingly, the shield portion 144 may inhibit a predefined level of electromagnetic signals, as may be appropriate for the specific configuration of the electronic device 104. For example, a specified level of electromagnetic interference may be acceptable based on the design and performance characteristics of various other components and assemblies with the electronic device 104, and thus, the shield portion 144 may be constructed to meet the specified level. The material and geometric properties of the shield portion 144 may also be at least partially influenced by a size and/or shape of the electrode 148. For example, the available footprint of the shield portion 144 along the molded structure 136 may be limited by a size and shape of the electrode 148 (also positioned along the molded structure 136), and thus various other parameters may be tuned (e.g., thickness, conductivity, and so on) such that the shield portion 144 controls electromagnetic signals at a desired level. Depending on the implementation, the shield portion 144 may be electrically grounded, connected to an electrical voltage source, or be allowed to electrically float.

The electrode 148 of the metal layer 140 may be electrically coupled with the group of electrical components 128 that are positioned within (or partially within) the molded structure 136. Broadly, the electrode 148 may be an electrical conductive surface or element positioned along or formed into the molded structure 136 and that is configured to receive an input or signal, such as an electrical, optical, magnetic, or capacitive signal and so on. The electrode 148 may be electrically coupled with the group of electrical components 128 such that the group of electrical components 128 is responsive to, or otherwise receives or registers, the input received by the electrode 148. Conversely, the electrode 148 and the group of electrical components 128 may be electrically coupled such that the electrode 148 receives or is otherwise responsive to a signal generated by the group of electrical components 128 and/or other component or feature of the substrate 132. As such, despite being fully or partially encapsulated within the molded structure 136, the group of electrical components 128 may be coupled with various components and assemblies of the electronic device 104 and/or be used to sense various internal and/or external environments or signals of the electronic device 104 using the electrode 148, as described herein.

The electrode 148 and the group of electrical components 128 may thus be electrically coupled in a variety of manners to facilitate the foregoing functionality. In one embodiment, the electrode 148 and the group of electrical components 128 may be electrically connected by a conductive path. This may take numerous forms, and various embodiments of such are described herein. As possible examples, the circuit assembly 124 may include electrically conductive vias extending substantially through the molded structure 136 and electrically connecting the substrate 132 and the electrode 148 (e.g., as described with respect to FIG. 3B) and/or a flexible circuit positioned along (or otherwise electrically coupled with) the electrode 148 and extending along a curve around the molded structure 136 (e.g., as described with respect to FIG. 3C). In other circumstances, the electrode 148 and the group of electrical components 128 may additionally or alternately be capacitively, magnetically, and/or optically coupled to one another. For example, the electrode 148 may form, or be a component of, a capacitive, magnetic, or optical-based sensor that cooperates with the group of electrical components 128 in a corresponding manner to detect an input.

Additionally or alternatively, the electrode 148 may also define a sensing element. The sensing element may be formed along an outer surface of the circuit assembly 124 and be configured to detect one or more inputs, as described herein. For example, the electrode 148 may be, or form a component of, a capacitive sensor, optical sensors, antenna, strain gauge, magnetic sensors, among various other possibilities. As such, the group of electrical components 128 may be responsive to (and/or used in conjunction with) the electrode 148 to detect various inputs associated with the electronic device 104, despite being partially or fully encapsulated within the molded structure 136. Possible inputs may include a touch and/or force input received along a portion of the enclosure 108 (such as a sidewall or back surface), the display 112, and/or other region or electronic device 104. This may also include externals or wireless signals or inputs such as an input from an interconnected charging assembly and/or a wireless signal (where the electrode 148 forms an antenna). As such, the electrode 148 may be employed in a variety of configurations within an electronic device 104 in order to facilitate various communication and control functions of the electronic device 104 (e.g., as described in greater detail below with respect to FIGS. 4A and 4B).

The circuit assembly 124 may not be limited to defining a single sensing element or establishing a single electrical connection with another component or assembly of the electronic device 104. For example, the electrode 148 may be one of a group of electrode pads (e.g., first electrode, second electrode, third electrode, and so on) defined by the metal layer 140 along a surface of the molded structure 136. Each of the first, second, third, etc. electrodes may define a distinct sensing element and/or contact pads. As one possibility, a first electrode may define a sensing element (e.g., such as a capacitive, optical, strain, magnetic sensor, or the like) and a second electrode may define a contact pad used to electrically couple the group of electrical components 128 with another component or assembly of the electronic device 104. As shown in the embodiment of FIG. 2, the electrode 148 may be one of a group of four contact pads; however, other embodiments, including circuit assemblies having more or fewer than four contacts pads, are possible.

The shield portion 144 and the electrode 148 may be formed or positioned along a common or substantially continuous surface of the molded structure 136. For example, the shield portion 144 and the electrode 148 may be formed directly on or along a surface of the molded structure 136 opposite the substrate 132 by a deposition technique, including a sputter deposition or other physical vapor deposition process or technique. As such, a masking layer may be used to define the voids 152 separating the shield portion 144 and the electrode 148; however, this is not required. The voids 152 may be etched or excavated as needed to define the various features. Printing, coating, or plating may also be appropriate to apply the metal layer 140. Additionally or alternatively, as described above, the molded structure 136 may be formed from a metal-doped plastic material. As such, in some embodiments, the metal layer 140 may be formed from the metal-doped plastic material of the molded structure 136 by using a laser direct structuring (LDS) technique. In other cases, the metal layer 140 may be a separate substrate, film, sheet, or other layer applied to a target surface or region of the molded structure 136.

The circuit assembly 124 may be arranged in a variety of manners within the enclosure 108 based at least in part on a configuration of the electrode 148 to detect a specified input. In the embodiment depicted in FIG. 2, the electrode 148 is positioned proximate display 112, and thus may be used to detect an input along the display 112, such as a force input, as one example. In other implementations, such as that described with respect to FIG. 4A, the electrode 148 may be positioned proximate the interior surface 111, which may be beneficial for detecting a position of a user relative to the band 120; however, other configurations and sensors are contemplated herein.

FIGS. 3A-3D depict cross-sectional views of the circuit assembly 124 of FIG. 2, taken along line A-A, according to various configurations. In particular, FIGS. 3A-3D depict the group of electrical components 128, the substrate 132, the molded structure 136, and the metal layer 140 in various different arrangements that allow the metal layer 140 to provide an electromagnetic shield for the group of electrical components 128 and define an electrode (e.g., a contact pad or sensing element) or other electrical element that is electrically coupled with the group of electrical components 128, as described herein. To facilitate the foregoing, and as described herein with respect to FIG. 2, the metal layer 140 may include the shield portion 144 and the electrode 148, which may be separated (and electrically isolated) from one another by the void 152 (e.g., a space or gap).

Figure 3A:
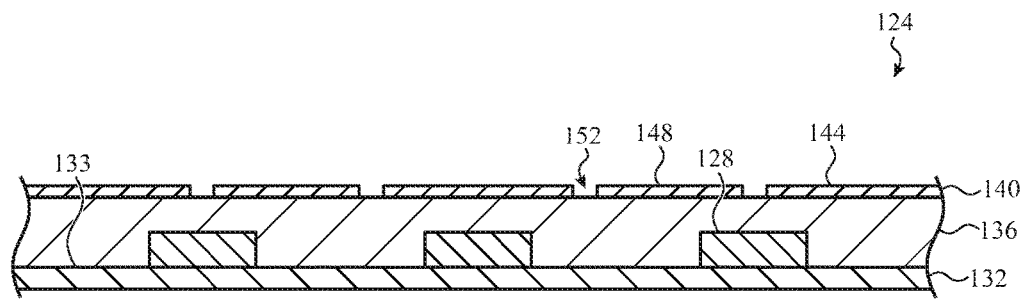
FIG. 3A depicts a cross-sectional view of the circuit assembly of FIG. 2, taken along section A-A of FIG. 2.

With reference to FIG. 3A, the circuit assembly 124 is shown in a first configuration. In the first configuration, the group of electrical components 128 may be positioned along a surface of the substrate 132, such as surface 133. The substrate 132 may be a structural component of the circuit assembly 124, and the surface 133 may be used as a mounting surface or the like to secure the group of electrical components 128 with the circuit assembly 124. The substrate 132 may be a printed circuit board, printed circuit, or other board or sheet having electrical traces that are configured to electrically couple the group of electrical components 128 and the substrate 132. The group of electrical components 128 are depicted in FIG. 3A as including three electrical components as a sample illustration; more or fewer electrical components may be included within the circuit assembly 124.

The molded structure 136 may be formed over the surface 133 and the group of electrical components 128 (and/or a subset or entire group of electrical components). As shown in FIG. 3A, the molded structure 136 may encapsulate substantially all of the surface 133 and the group of electrical components 128. In other embodiments, however, the molded structure 136 may partially cover the group of electrical components 128 and/or the surface 133. The molded structure 136 need not be a continuous structure along the substrate 132, but rather, in some cases, may be multiple discrete molded structures that form the molded structure 136.

The metal layer 140 may be positioned along, on or over the molded structure 136 opposite the surface 133. As such, the molded structure 136 may physically separate the metal layer 140 and the group of electrical components 128 and/or the substrate 132. This may help electrically isolate portions of the metal layer 140 (e.g., shield portion 144) from the group of electrical components 128 and/or the substrate 132. The metal layer 140 may define voids 152 (e.g., spaces or gaps) that separate the shield portion 144 from the electrode 148 along the surface of the molded structure 136.

As shown in the embodiment of FIG. 3A, the electrode 148 of the metal layer 140 may also be separated from the group of electrical components 128 by the molded structure 136. The electrode 148 and the group of electrical components 128 may be physically separated while being electrically coupled to one another. For example, the electrode 148 and the group of electrical components 128 may be electrically coupled to one another via a conductive path, via, terminal, or other circuit, including a flexible circuit (e.g., as described with respect to FIGS. 3B and 3C). The electrode 148 may also be electrically coupled to one another using other techniques, including being capacitively, magnetically, and/or optically coupled to one another (e.g., as may be the case where the electrode 148 and the electrical component cooperate to form a capacitive touch-sensor, among other possibilities). In some cases, the electrode 148 may be electrically coupled to the substrate 132 without being coupled to one or more of the electrical components 128 of the circuit assembly 124. For example, electrical signals from the electrode 148 may be passed through the substrate 132 to a separate component without passing through or being connected to one or more of the electrical components 128 of the circuit assembly 124.

Figure 3B:
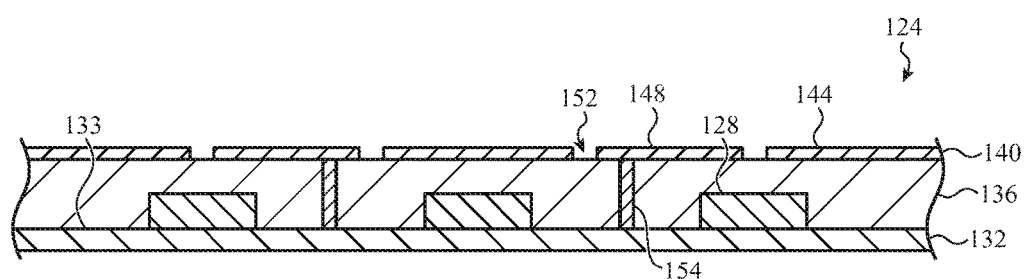
FIG. 3B depicts a cross-sectional view of another embodiment of the circuit assembly of FIG. 2, taken along second A-A of FIG. 2.

With reference to FIG. 3B, the circuit assembly 124 is shown in a second configuration. In the second configuration, the electrode 148 and the group of electrical components 128 are shown being electrically coupled using a conductive via 154. The conductive via 154 may form an electrically conductive path through the molded structure 136. For example, the conductive via 154 may extend from the electrode 148 (or a region about a periphery of the electrode 148) through the molded structure 136 and to the substrate 132. The conductive via 154 may be connected with one or more electrical traces on the substrate 132. As such, electrical signals may be transmitted between the electrode 148 and the substrate 132 using or via the substrate 132 and the conductive via 154.

The conductive via 154 may be formed using a variety of techniques that may produce an electrically conductive path extending through all, or a portion of, the molded structure 136. In one embodiment, holes or openings may be formed in the molded structure 136 and a substantially liquefied or viscous conductive material may be introduced into the hole or opening of the molded structure 136. Such material may subsequently be allowed to harden and form the conductive via 152. As such, it may be desirable to form the conductive via 152 prior to forming the metal layer 140 over the molded structure 136; however, this is not required. In other cases, the conductive via 152 may be a separate post, protrusion, wire, or the like that is inserted directly into the molded structure 136 (or corresponding hole or opening extending therethrough).

Figure 3C:
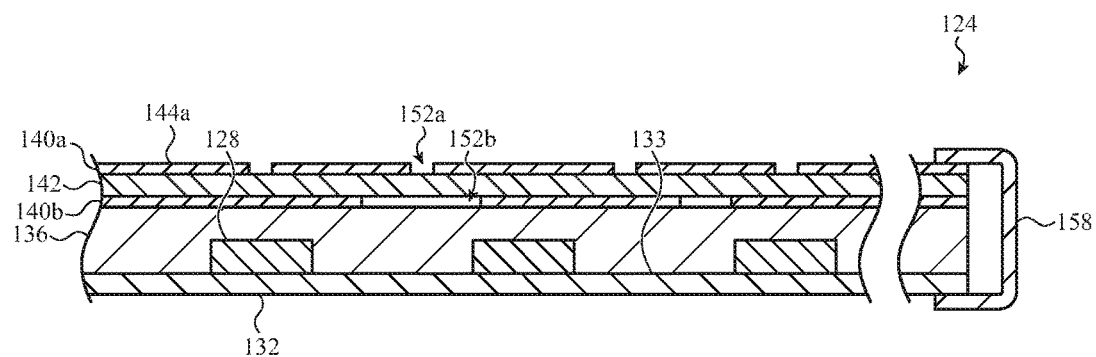
FIG. 3C depicts a cross-sectional view of another embodiment of the circuit assembly of FIG. 2, taken along section A-A of FIG. 2.

With reference to FIG. 3C, the circuit assembly 124 is shown in a third configuration. In the third configuration, the circuit assembly 124 is shown having multiple metal layers separated by an insulating (e.g., non-conductive) layer. For example, the circuit assembly 124 may include metal layers 140a, 140b that are separated within the circuit assembly 124 by an insulating layer 142. The metal layers 140a, 140b may be substantially analogous to the metal layer 140 described with respect to FIGS. 2-3B in that the metal layers 140a, 140b may provide an electromagnetic shield for the group of electrical components 128 and define a contact pad, sensing element, or other component that is electrically coupled with the group of electrical components 128. For example, the metal layer 140a may include a shield portion 144a configured to inhibit electromagnetic signals and an electrode 148a separated from the shield portion 144a by a void 152b that is electrically coupled with the group of electrical components 128. The insulating layer 142 may be any suitable non-conductive material, including silicon, rubber, various plastics, foam, and so forth.

Figure 5A:
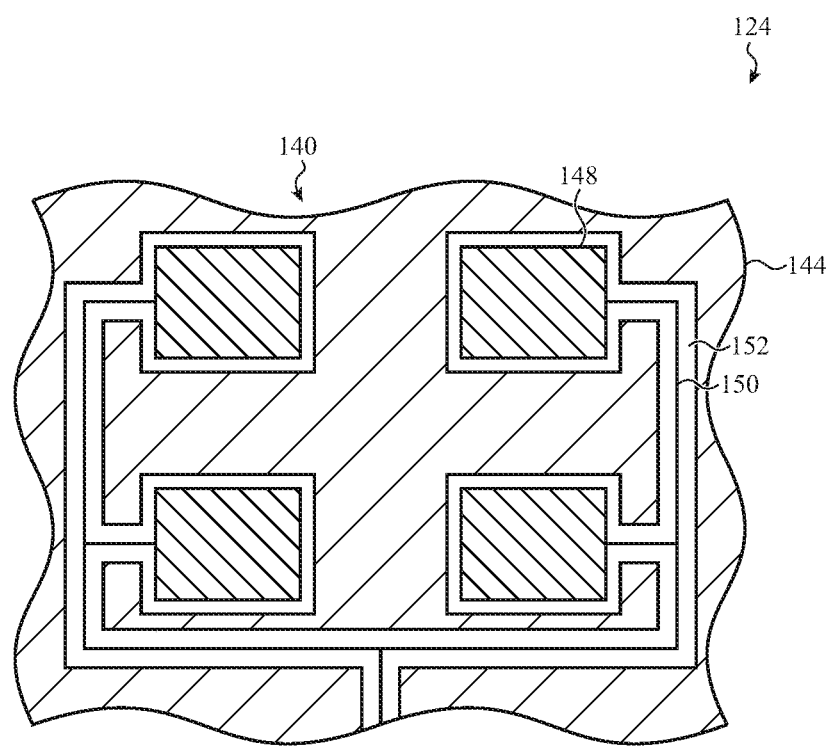
FIG. 5A depicts a cross-sectional top view of an embodiment of a circuit assembly.
Figure 5B:
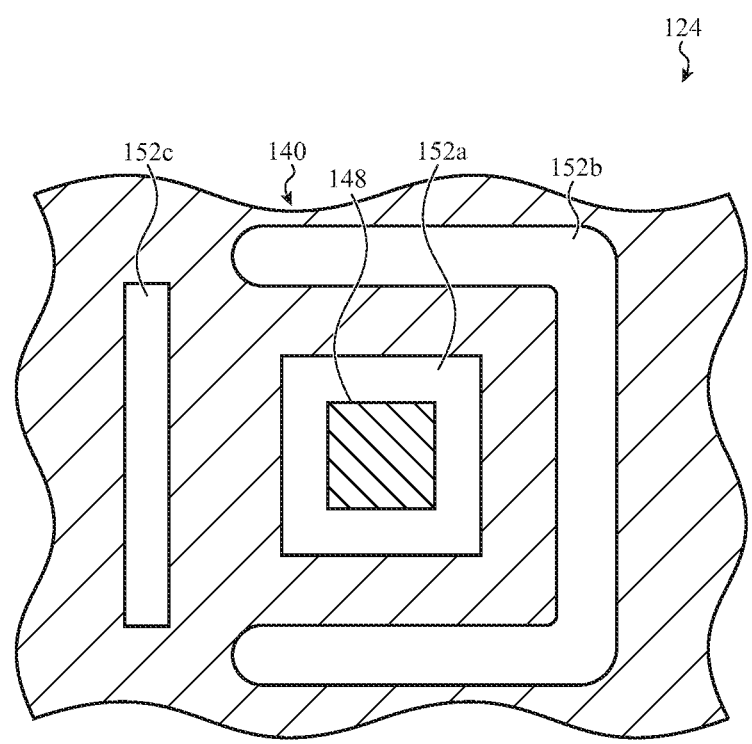
FIG. 5B depicts a cross-sectional top view of another embodiment of a circuit assembly.

The arrangement of multiple metal layers, separated by an insulating layer, may allow the circuit assembly 124 to mitigate various different levels of electromagnetic interference better than that of a single metal layer configuration, such as that shown in the configurations of FIGS. 5A and 5B. For example, the metal layers 140a, 140b may have distinct material and geometric parameters that may cooperate with one another to absorb and reflect a specified level of energy. This may include an embodiment where the metal layers 140a, 140b exhibit distinct thickness, electrical conductivities, and/or continuities (including distinct openings or other geometric features formed therein). As shown in the embodiment of FIG. 3C, the metal layer 140b may define a series of voids 152. The voids 152 may be tuned (e.g., sized, shaped, orientated, and so on) such the metal layers 140a, 140b collectively inhibit a particular source or predefined level of electromagnetic interference.

The third configuration of the circuit assembly 124, shown in FIG. 3C, also depicts another technique for electrically coupling an electrode (such as electrode 148a or any contact pad described herein) and the group of electrical components 128. In particular, FIG. 3C shows the electrode 148a and the electrical component electrically coupled using a flexible circuit 158. The flexible circuit 158 may form an electrically conductive path around the molded structure 136. For example, the flexible circuit 158 may be positioned along the metal layer 140a (electrically connected with the electrode 148a) and extend along a curve around the molded structure 136 toward the substrate 132. The flexible circuit 158 may be connected with one or more electrical traces on the substrate 132. As such, electrical signals may be transmitted between the electrode 148a and the substrate 132 using or via the substrate 132 and the flexible circuit 158.

Figure 3D:
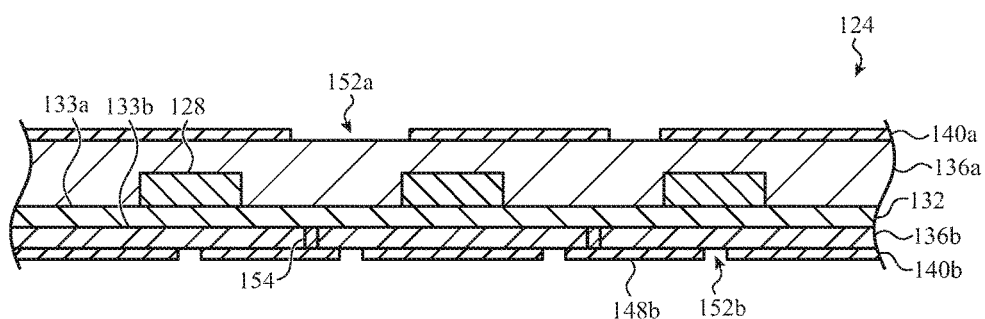
FIG. 3D depicts a cross-sectional view of another embodiment of the circuit assembly of FIG. 2, taken along section A-A of FIG. 2.

With reference to FIG. 3D, the circuit assembly 124 is shown in a fourth configuration. In the fourth configuration, the group of electrical components 128 and the substrate 132 may be partially or fully encapsulated between various molded and metal layers. The multiple molded layers may facilitate forming a protective barrier between the group of electrical components 128 and an external environment and providing an electromagnetic shield with an integrated contact pad, as described herein.

In the embodiment depicted in FIG. 3D, the circuit assembly may include molded layers 136a, 136b. The molded layers 136a, 136b may be substantially analogous to the molded structure 136 described above with respect to FIG. 2-3C in that the molded layers 136a, 136b may be structural components of the circuit assembly 124 that partially or fully encapsulate the group of electrical components 128. The first molded structure 136a may be formed along a first surface 133a of the substrate 132 and partially or fully over one or more surfaces of the group of electrical components 128. The second molded structure 136b may be formed along a second surface 133b of the substrate 132, opposite the first surface 133a. In this regard, the substrate 132 may be positioned directly between the molded layers 136a, 136b such that the substrate 132 may be fully encapsulated within a molded material, such as an injection moldable plastic, in certain embodiments. In other circumstances, only selected regions of the substrate 132 may be fully encapsulated within a molded material, for example, which may be the case where the first molded structure 136a extends over substantially all of the first surface 133a and the second molded structure 136b extends over only selective portions or regions of the second surface 133b.

The circuit assembly 124 of FIG. 3D may also include metal layers 140a, 140b. The metal layers 140a, 140b may be positioned along the molded layers 136a, 136b respectively. In particular, the metal layer 140a may be positioned along the molded structure 136a and the metal layer 140b may be positioned along the molded structure 136b. In this regard, the group of electrical components 128 and the substrate 132 may be positioned between the metal layers 140a, 140b and partially or full enclosed therein. The metal layers 140a, 140b may cooperate to inhibit electromagnetic interference and define one or more contact pads, sensing elements, terminals or the like that are electrically coupled with the group of electrical components 128. As one possibility, the metal layer 140b may define or include a shield portion 144b and an electrode 148b. The shield portion 144b may be electrically isolated from the group of electrical components 128 and the substrate 132 and configured to inhibit electromagnetic interference. The electrode 148b may be electrically coupled with the group of electrical components 128 and used to detect an input associated with an electronic device (e.g., electronic device 104 of FIG. 1). As shown in FIG. 3D, the electrode 148b may be electrically coupled to the group of electrical components 128 via the conductive via 154 which may extend through the molded structure 136b and electrically connect the substrate 132 and the electrode 148 according to techniques described herein; however, other techniques for electrically coupling the electrode 148b and the group of electrical components 128 are possible.

Figure 4A:
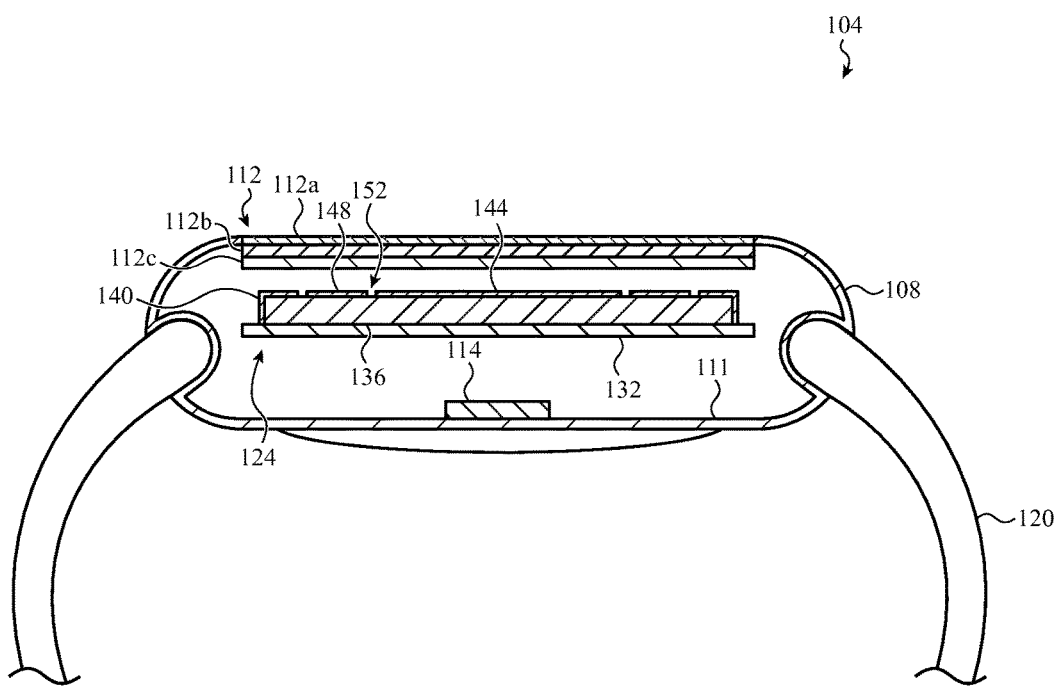
FIG. 4A depicts a cross-sectional view of the example electronic device of FIG. 2 in a first configuration, taken along section B-B of FIG. 2.
Figure 4B:
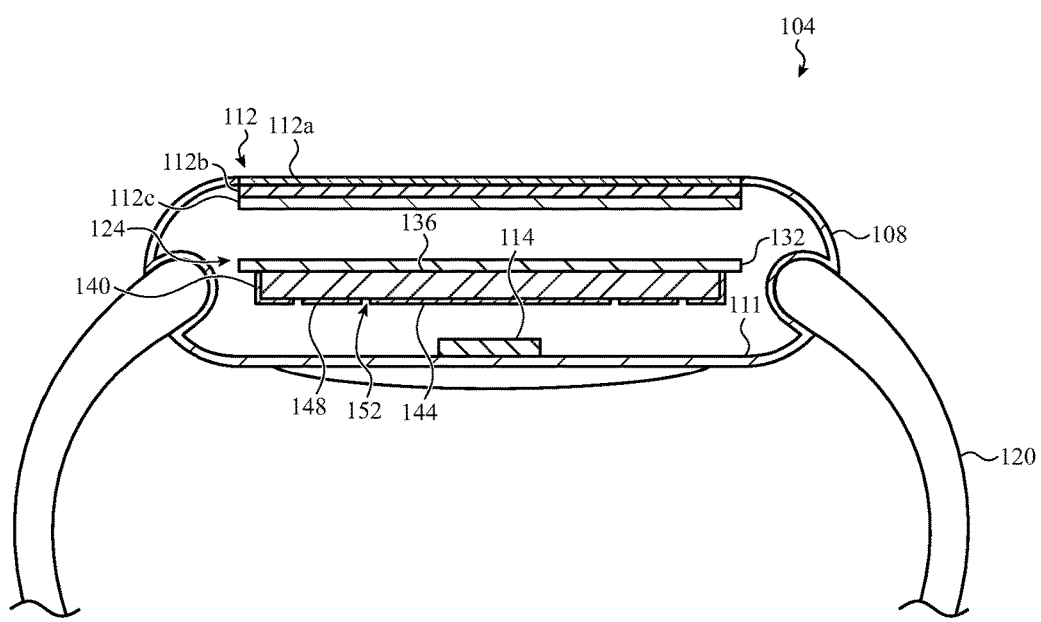
FIG. 4B depicts a cross-sectional view of the example electronic device of FIG. 2 in a second configuration, taken along section B-B of FIG. 2.

FIGS. 4A and 4B depict cross-sectional views of the electronic device 104 and circuit assembly 124, taken along line B-B of FIG. 2. In particular, FIGS. 4A and 4B depict the circuit assembly 124 positioned in various different orientations and configurations within the enclosure 108 of the electronic device 104. The various different orientations and configurations described herein may facilitate use of the circuit assembly 124 and associated contact pads to detect an input and/or perform a control and/or communications function of the electronic device 104.

In the embodiments of FIGS. 4A and 4B, the electronic device 104 is shown as having the display 112 at least partially positioned within an opening defined in a top surface of the enclosure 108. The display 112 may be a touch and/or force sensitive display that is responsive to input received along an exterior surface of the display 112. The display 112 may be a multi-layered structure having various components that allow the display 112 to form an exterior surface of the electronic device 104, display a graphical output (e.g., an icon, graphic, text, or the like) along the exterior surface, and/or be responsive to the received touch and/or force input. As such, as depicted in FIG. 4A, the display 112 may include a cover layer 112a, a display layer 112b, and a sensing layer 112c. The cover layer 112a may be a transparent or translucent structure that forms an exterior surface of the electronic device 104. Sample materials include sapphire, silica glass, or the like. The display layer 112b may be a light emitting layer that includes various components (light emitting diodes (LEDs), micro-LEDs, a liquid crystal display (LCD), organic light emitting diode (OLED), fluorescent light, and so on) that emit light toward the cover layer 112a to render a graphical output (e.g., an icon, symbol, glyph, graphic, or the like) along the exterior surface of the cover layer 112a.

The sensing layer 112c may be used to detect a touch and/or force input received along the display 112 (e.g., along or proximal to the cover layer 112a). In one embodiment, the sensing layer 112c may be, or form a component of, a capacitive sensor that uses a mutual or self-capacitance configuration to detect a touch input (contact) or proximity of a user relative to the cover layer 112a. The sensing layer 112c may also form a component of a capacitive force-sensor to detect a force input (deflection) of the cover layer 112a inward into the enclosure as the result of a user input.

In some instances, the sensing layer 112c may be configured to cooperate with the electrode 148, group of electrical components 128, and/or other components or assemblies of the circuit assembly and/or the electronic device 104 to detect a slight bending or deformation of the cover layer 112a caused by a user input using a change in capacitance measured between the sensing layer 112c and the cooperating component of the electronic device 104. More specifically, one or more electrodes of the sensing layer 112c may be separated from one or more electrodes 148 of the circuit assembly by an air gap or a compressible layer. When a force is applied to an external surface of the device 104 (e.g., to a surface of the display 112), a portion of the device 104 may deflect and reduce the gap or distance between the sensing layer 112c and the electrodes 148. The change in distance may result in a change in capacitance between the sensing layer 112c and the electrodes 148, which may be sensed and correlated to the applied force. The sensing layer 112c, however, is not limited to embodiments in which an input is capacitively detected; other sensors are contemplated herein, including magnetic sensors, optical sensors, strain sensors, and so on.

As described herein, the electronic device 104 may include multiple electrical components, assemblies, or the like that may facilitate a control and/or communication function of the electronic device 104. As depicted in the embodiment of FIGS. 4A and 4B, the electronic device 104 may include an auxiliary component 114. The auxiliary component 114 may be representative of one or more of the multiple electrical components of the electronic device 104 that may be external to, or otherwise separated from, the circuit assembly 124. In this regard, it will be appreciated that the auxiliary component 114 may include substantially any appropriate electronic (or non-electronic) component configured for use with the electronic device 104. As described in greater detail below with respect to FIG. 4B, the circuit assembly 124 and the electrode 148 may be positioned proximate to the auxiliary component 114 in order to facilitate a control and/or communication function of the electronic device 104.

In one configuration, the auxiliary component 114 may define, or be a component of, a communications component or assembly, such as an antenna of the electronic device 104. For example, the auxiliary component 114 may be a structure or assembly configured to receive and/or transmit a wireless communication signal containing data or other information used to control a function of the electronic device 104. As such, various components of the electronic device 104 (such as the display 112) may be responsive to, or otherwise manipulated by, the signal received and/or transmitted by the auxiliary component 114. The auxiliary component 114 may thus include or be operably connected to an antenna that is configured to transmit and receive wireless communication signals. As described with respect to FIG. 5, the antenna, or any other component or assembly, may be configured to operate in a particular set of electromagnetic conditions. In some instances, one or more elements of the metal layer of the circuit assembly 124 may be configured to facilitate or optimize the electromagnetic conditions for an antenna associated with the auxiliary component 114. Additionally or alternatively, one or more elements of the metal layer of the circuit assembly 124 may be configured to shield electronic components of the circuit assembly 124 from electromagnetic interference generated by the auxiliary component 114 (or any other source or electromagnetic noise or interference).

Additionally or alternatively, the auxiliary component 114 may define, or be a component of, a sensing element, such as a position or proximity sensor of the electronic device 104. For example, the auxiliary component 114 may be a structure or assembly configured to detect a position of a user relative to the band 120 and/or the electronic device 104. This may be accomplished via capacitive, magnetic, strain, optical and/or other sensing techniques. As one possibility, the auxiliary component 114 may be an electrode of a capacitance-based sensor that may use a mutual or self-capacitance configuration to detect a touch input (contact) and/or proximity of a user relative to the enclosure 108 (e.g., relative to the interior surface 111 along which the auxiliary component 114 may be positioned). This information may be correlated with a known or given position and/or orientation of the band 120 to estimate the proximity of position of a user relative to the band 120. Accordingly, one or more components or assemblies of the electronic device 104, including the circuit assembly 124 and associated electrical component (e.g., group of electrical components 128), may use this information to estimate various associated parameters, including estimating a user wearing the electronic device 104 (detecting an "on-wrist" configuration), a tightness or pressure of the electronic device 104 on the user, and/or tilt of the electronic device 104 relative to a user, among other possible parameters. Subsequently, various components of the electronic device 104 (such as display 112) may be responsive to, or otherwise manipulated by, the parameters or conditions detected by the auxiliary component 114. As one possibility, icons or graphics depicted at the display 112 may be manipulated in a particular manner based on a detection or estimation that the user is wearing the electronic device 104, the electronic device 104 is being worn too tight or too loose, the electrical device is tilted, and so on.

Further, the auxiliary component 114 may define, or be a component of, a charging assembly, including an inductive and/or hardwired charging assembly or region of the electronic device 104. For example, the auxiliary component 114 may be a structure or assembly configured to detect and receive an electrical charge. The electrical charge may be received from a variety of external devices and/or sources and used to charge or recharge a battery or other power storage component or system of the electronic device 104.

It will be appreciated that the foregoing description of various embodiments of the auxiliary component 114 is presented for purposes of illustration only. Rather than be limited to the foregoing example, the auxiliary component 114 may be substantially any component of the electronic device 104, including various other antennas, sensors, switches, processing units, charging assemblies, and so on. Further, while the auxiliary component 114 is shown in FIGS. 4A and 4B as being positioned along the interior surface 111, the auxiliary component 114 may be positioned along any surface of the electronic device 104, including external surfaces and/or within or partially within a sidewall defining the enclosure 108.

With reference to FIG. 4A, the electronic device 104 is shown as having the circuit assembly 124 and the electrode 148 positioned proximate the display 112. In particular, the electrode 148 may be positioned proximate the sensing layer 112c. This may allow the sensing layer 112c and the electrode 148 to cooperate to detect a touch and/or force input along an exterior surface of the electronic device 104, such as that defined by the cover layer 112a. In a particular embodiment, the display 112 may be configured to slightly bend or deflect into the enclosure 108 in response to a force input received at the cover layer 112a. Accordingly, the sensing layer 112c and the electrode 148 may be configured to form, or define various components of, a capacitive-based force sensor. For example, the sensing layer 112c and the electrode 148 may be separated by a gap within the enclosure 108. Deflection or bending of the display 112 may alter a size of the gap, and thus alter a capacitance measured between the sensing layer 112c and the electrode 148. The sensing layer 112c and the electrode 148 may cooperate to detect such alterations in the capacitance. The alteration in the capacitance may be used by the circuit assembly 124 (or other component or assembly of the electronic device 104) to estimate a force received along the display 112.

The circuit assembly 124 and the electrode 148 may be positioned proximate to the display 112 in a variety of other configurations. For example, the electrode 148 may be used to electrically connect the display 112 or another associated component to the circuit assembly 124. Additionally or alternatively, the electrode 148 may form a sensing element of another type, including an optical, magnetic, or strain-based sensing element that may or may not be directly coupled with the display 112. Further, it may be beneficial to arrange the circuit assembly 124 proximate to the display 112 for design and packaging considerations of the electronic device 104 (e.g., arranging the circuit assembly 124 proximate the display 112 may maximize available volume within the enclosure 108 for other components and assemblies of the electronic device 104).

With reference to FIG. 4B, the electronic device 104 is shown as having the circuit assembly 124 and the electrode 148 positioned proximate the auxiliary component 114. This may allow the electrode 148 and the auxiliary component 114 to cooperate to detect one or more inputs of the electronic device, including one or more inputs along a portion of the enclosure 108 and/or those associated with the band 120 (such as detecting or estimating a position of a user relative to the band 120). In some cases, the electrode 148 may be separated from the auxiliary component 114 (as shown in FIG. 4B) in order to facilitate detecting the input (e.g., as may be the case where the electrode 148 and the auxiliary component cooperate to define a capacitance based sensor). In other cases, the electrode 148 and the auxiliary component 114 may be directly electrically connected. Where the auxiliary component is an antenna (or other electrical component sensitive to electromagnetic radiation), the circuit assembly 124 may be configured such that the electromagnetic shield of the circuit assembly 124 limits interference with the auxiliary component 114.

FIGS. 5A-5D depict cross-sectional top views of the circuit assembly 124. In particular, FIG. 5A-5D depict cross-sectional views of various embodiments of the metal layer 140 and the shield portion 144 and the electrode 148. As described above, the shield portion 144 may be configured to limit electromagnetic signals within the circuit assembly 124 and the electronic device 104. The electrode 148 may be electrically coupled with an electrical component (e.g., group of electrical components 128 of FIG. 2) and used to detect a signal, input, and/or other parameters. The embodiments of FIGS. 5A-5D depict various different geometries and configurations of the electrode 148 (and corresponding shield portion 144) that may be used to detect various different types of input, for example, by defining various different sensing elements. The shield portion 144 may also be modified to vary the level of electromagnetic interference.

With reference to FIG. 5A, the circuit assembly 124 is shown in a configuration in which the electrode 148 is one of a group of four contact pads. The group of contact pads may be separated from the shield portion by the void 152 (e.g., a space or gap). As such, the void 152 may be shaped to accommodate each of the group of contact pads (e.g., each of the group of contact pads may be separated from the shield portion 144, and from one another, by the void 152). The void 152 may also be shaped to accommodate electrical traces or other electrically conductive paths that may electrically connect various elements of the circuit assembly 124.

As shown in embodiment of FIG. 5A, the circuit assembly 124 may include electrical traces 150. The electrical traces 150 may be positioned within and/or along the void 152 and remain electrically isolated or separated from the shield portion 144. For example, the electrical traces 150 may be formed into a surface of the molded structure 136 (described with respect to FIG. 2) using an LDS technique. Additionally or alternatively, the electrical traces 150 may be a separate wire, solder, connector, or other component positioned along a surface of the molded structure 136 and with the void 152.

The electrical traces 150 may electrically connect particular ones of the group of contact pads to one another. The electrical traces 150 may also connect particular ones of the group of electrical traces to one or more other components of the circuit assembly 124 and/or other components and/or assemblies of the electronic device 104, as may be appropriate for a given application. It will be appreciated that the particular configuration of the electrical traces 150 depicted in FIG. 2 is presented for purposes of illustration only. The electrical traces 150 may be arranged in any appropriate manner to facilitate an electrical connection with one or more or all of the group of contact pads. As such, in some cases, the particular configuration of the electrical traces 148 may be based on the configuration of the particular one of contact pads (e.g., a different configuration of electrical traces 150 may be appropriate when the electrode 148 defines a capacitive sensor as compared to an embodiment where the electrode 148 defines an antenna, as one example).

With reference to FIG. 5B, the circuit assembly 124 is shown in an embodiment in which various different voids, openings, holes, through portions, or the like are selectively defined within the metal layer 140. This may be used to tune the shield portion 144 and control a level of electromagnetic interference within the circuit assembly 124 and the electronic device 104. For example, as described above, the material and geometric properties of the shield portion 144 may be modified in order to control a level of energy reflected and absorbed by the shield portion 144, including factors such as conductivity, thickness, and continuity. In this regard, the shape of the shield portion 144 may impact the level of electromagnetic interference within the circuit assembly 124 and the electronic device 104.

As shown in the embodiment of FIG. 5B, the shield portion includes voids 152a, 152b, 152c. The voids 152a, 152b, 152c may each be a distinct shape and size and may cooperate together such that the shield portion 144 exhibits a predefined characteristic that limits a specified amount of electromagnetic interference. For example, the void 152a may be a rectangular shaped opening that surrounds the electrode 148. The void 152b may be a U-shaped opening that is positioned at least partially around the void 152a. The void 152c may be an elongated opening. It will be appreciated that the particular size and orientation of the voids 152a, 152b, 152c is presented for purposes of illustration. Other sizes and orientations are contemplated as may be beneficial to control a level of electromagnetic interference within the circuit assembly 124 and the electronic device 104.

Selectively controlling a level of electromagnetic interference may be beneficial, for example, in order to limit, or otherwise define a level of electromagnetic interference experienced by another component or assembly of the electronic device 104, such as an auxiliary component or antenna of the electronic device 104 (e.g., auxiliary component 114 of FIGS. 4A and 4B). For example, an antenna of the electronic device 104, external to, or separated from, the circuit assembly 124, may be optimally or efficiently operated at a specified or certain level of electromagnetic interference. For some antennas, peak efficiency may be achieved in an environment with a particular amount of electromagnetic interference; too little or too much electromagnetic interference and performance may decline. Accordingly, the metal layer 140 may inhibit electromagnetic signals (e.g., of the circuit assembly 124) at a level corresponding to the specified level of electromagnetic interference for the antenna. To illustrate, the voids 152a, 152, 152c may be specifically calibrated to control a level of energy reflected and absorbed by the shield portion 144 and thus cause the metal layer to exhibit the resulting characteristics that may contribute to inhibiting the desired amount of electromagnetic signals. Furthermore, the shield portion 144 may be grounded, coupled to a voltage source, or be allowed to electrically float, depending on the application.

Figure 5C:
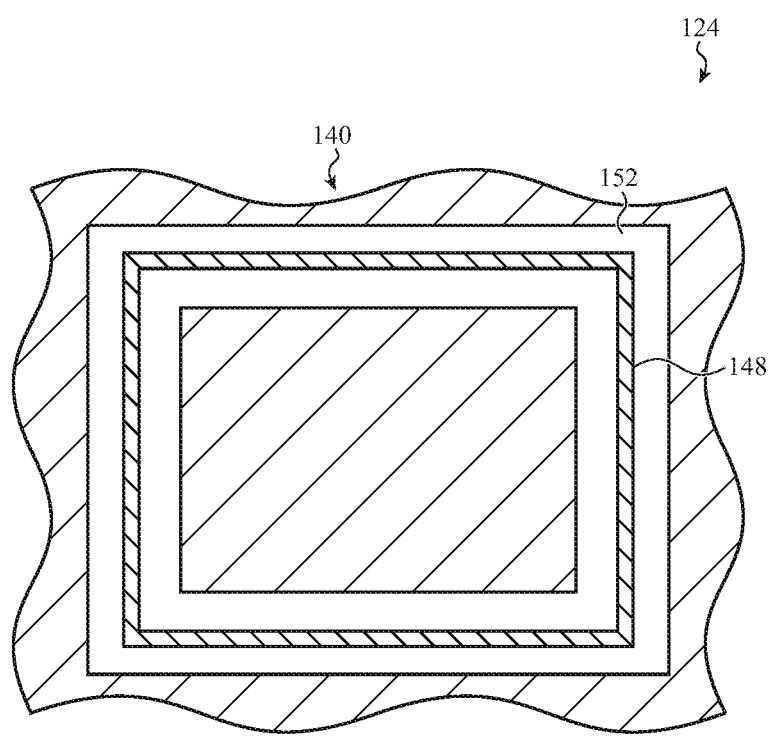
FIG. 5C depicts a cross-sectional top view of another embodiment of a circuit assembly.

With reference to FIG. 5C, the circuit assembly 124 is shown in a configuration in which the electrode 148 defines an antenna, portion of an antenna, or otherwise be configured to facilitate wireless communications. The antenna may be a component or assembly formed or positioned along the outer surface of the circuit assembly 124 (along the molded structure 136) and configured to receive and/or transmit various wireless signals. The antenna may be electrically coupled with one or more electrical components of the circuit assembly 124 (e.g., group of electrical components 128 of FIG. 2). This may allow the circuit assembly 124 to receive the signals of the antenna and optionally use the signals to control a function of the electronic device 104. By incorporating the antenna on the circuit assembly 124, the size or relative footprint of the control and/or communication components of the electronic device 104 may be reduced.

Figure 5D:
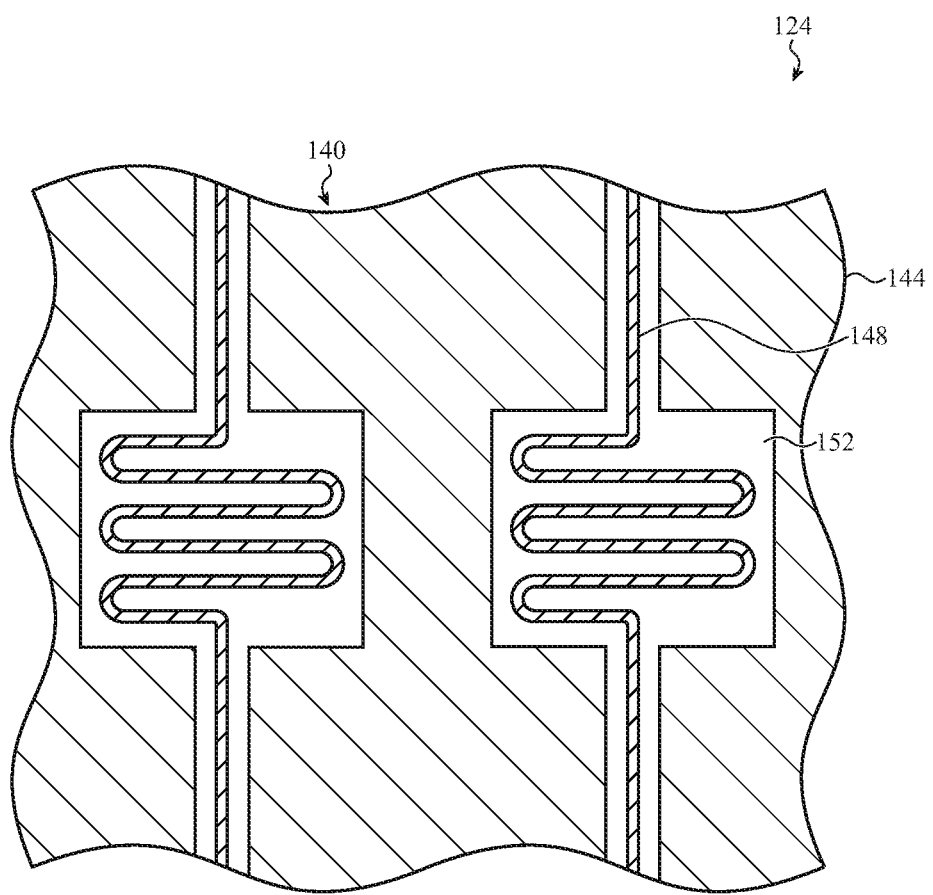
FIG. 5D depicts a cross-sectional top view of another embodiment of a circuit assembly.

With reference to FIG. 5D, the circuit assembly 124 is shown in a configuration in which the electrode 148 defines a strain sensor. The strain sensor may be a component or assembly formed or positioned along the outer surface of the circuit assembly 124 (along the molded structure 136) and configured to detect strain along the outer surface. For example, the circuit assembly 124 may be momentarily bent or deformed in response to a user input. This may cause the strain sensor defined by the electrode 148 to correspondingly elongate or contract. An electrical property of the electrode 148 may be sensitive to the contraction or elongation. The electrical property may therefore be measured to estimate the force input that caused the contraction or elongation. The strain sensor defined by the electrode 148 may be electrically coupled with the group of electrical components 128 (or other component) of the circuit assembly 124. This may allow the electrical component to cooperate with the electrode 148 to measure the resulting strain (from the elongation and contraction) and estimate the force input. By incorporating the strain sensor on the circuit assembly 124, the size or relative footprint of the control and/or communication components of the electronic device 104 may be reduced. In other embodiments, the electrode 148 may define other sensing elements, as described herein.

FIGS. 6A-7B depict various electronic devices having a circuit assembly, such as the circuit assembly 124 described herein. Broadly, a circuit assembly having an electromagnetic shield with an integrated contact pad may be used in substantially any appropriate electronic device. The electromagnetic shield may have a shield portion configured to inhibit electromagnetic interference within the circuit assembly and corresponding electronic device. The electromagnetic shield may also have a contact pad, separated from the shield portion, electrically coupled with an electrical component of the circuit assembly and used to detect an input associated with the corresponding electronic device.

Figure 6A:
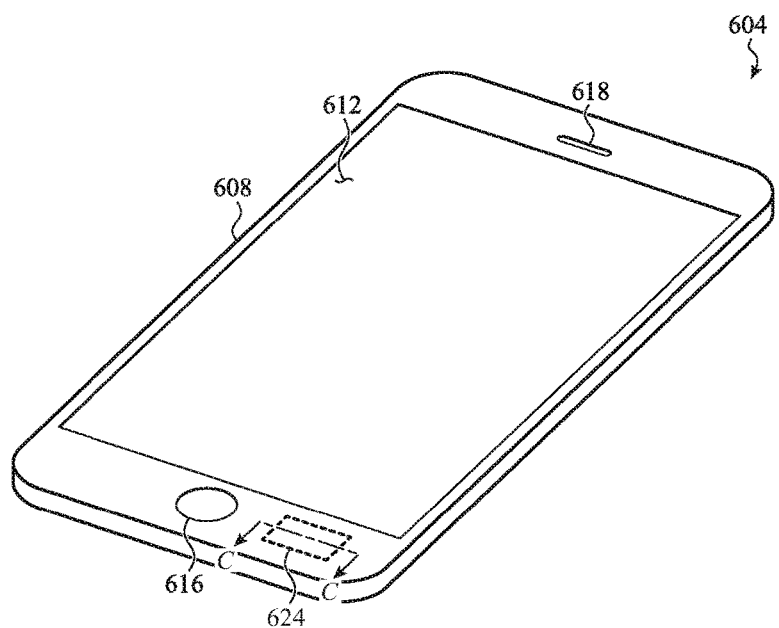
FIG. 6A depicts another sample electronic device having a circuit assembly.

FIG. 6A depicts an electronic device 604. The electronic device 604 may be a smart phone. For purposes of illustration, the electronic device 604 is shown as having an enclosure 608, a display 612, one or more input/output members 616, and a speaker 618. It should be noted that the electronic device 604 may include various other components, such as one or more ports (e.g., charging ports, data transfer ports, or the like), additionally input/out buttons, and so on. As such, the discussion of any electronic device, such as electronic device 604 is meant as illustrative only.

The electronic device 604 may also include a circuit assembly 624 (shown in phantom line). The circuit assembly 624 may be substantially analogous to the circuit assembly 124 described with respect to FIGS. 2-5D. For example, the circuit assembly 624 may have a metal layer or an electromagnetic shield configured to inhibit electromagnetic interference. The electromagnetic shield may also include an integrated electrode (e.g., a contact pad or sensing element) electrically coupled to an electrical component of the circuit assembly 624 (or other component or assembly of the electronic device 604) and configured to detect an input associated with the electronic device 604.

Figure 6B:
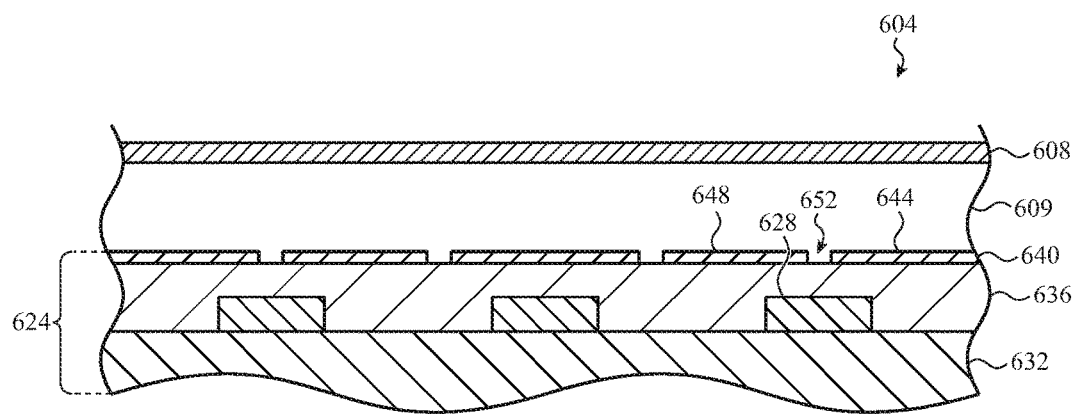
FIG. 6B depicts a cross-sectional view of the sample electronic device of FIG. 6A, taken along section C-C of FIG. 6A.

FIG. 6B depicts a cross-sectional view of the electronic device 604, taken along line C-C of FIG. 6A. In particular, FIG. 6B depicts a cross-sectional view of the circuit assembly 624 within the electronic device 604. As depicted in FIG. 6B, the circuit assembly 624 may be positioned within an interior volume 609 defined by the enclosure 608. Analogous to the components described with respect to the embodiments of FIGS. 2-5D, the circuit assembly 624 may include: a group of electrical components 628; a substrate 632; a molded structure 636; a metal layer 640; a shield portion 644; an electrode 648; and a void 652. The shield portion 644 may be configured to inhibit electromagnetic interference within the circuit assembly 624 and the electronic device 604. The electrode 648 may be electrically coupled with the group of electrical components 628. The electrode 648 may be used to connect the circuit assembly 624 with another component and/or assembly of the electronic device 604 and/or define a sensing element configured to detect one or more inputs associated with the electronic device 604.

Figure 7A:
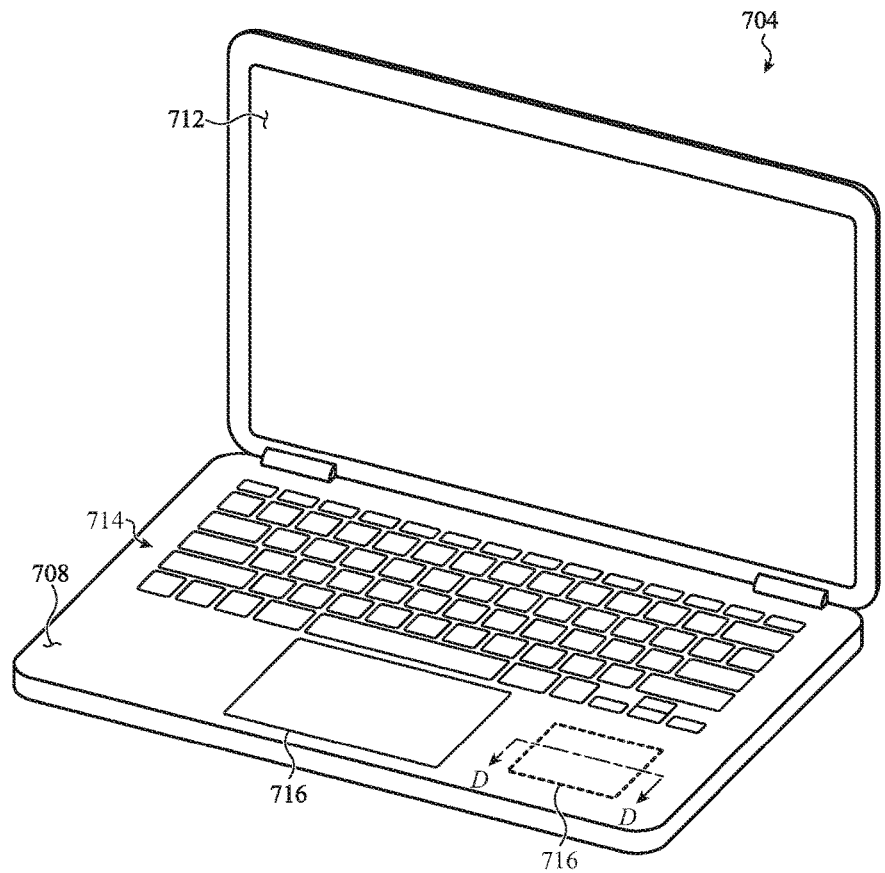
FIG. 7A depicts another sample electronic device having a circuit assembly.

FIG. 7A depicts an electronic device 704. The electronic device 704 may be a notebook computer. For purposes of illustration, the electronic device is shown as having an enclosure 708, a display 712, a key assembly 714, and one or more input/output members 716. It should be noted that the electronic device 704 may also include various other components, such as one or more ports (e.g., charging ports, data transfer ports, or the like), additional input/output buttons, and so on. As such, the discussion of any electronic device, such as electronic device 704, is meant as illustrative only.

The electronic device 704 may also include a circuit assembly 724 (shown in phantom line). The circuit assembly 724 may be substantially analogous to the circuit assembly 124 described with respect to FIGS. 2-5D. For example, the circuit assembly 724 may have an electromagnetic shield or metal layer configured to inhibit electromagnetic interference. The electromagnetic shield may also include an integrated contact pad electrically coupled to an electrical component of the circuit assembly 724 (or other component or assembly of the electronic device 704) and configured to detect an input associated with the electronic device 704.

Figure 7B:
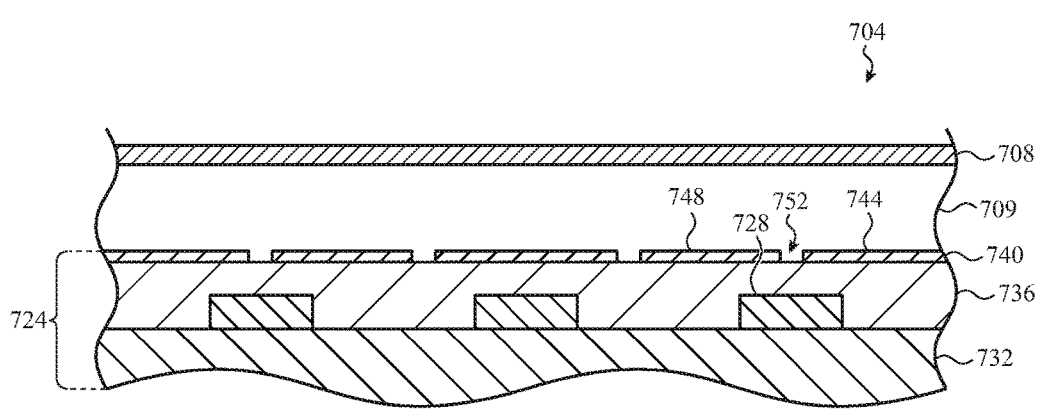
FIG. 7B depicts a cross-sectional view of the sample electronic device of FIG. 7A, taken along section D-D of FIG. 7A.

FIG. 7B depicts a cross-sectional view of the electronic device 704, taken along line D-D of FIG. 7A. In particular, FIG. 7B depicts a cross-sectional view of the circuit assembly 724 within the electronic device 704. As depicted in FIG. 7B, the circuit assembly 724 may be positioned within an interior volume 709 defined by the enclosure 708. Analogous to the components described with respect to the embodiments of FIGS. 2-5D, the circuit assembly 724 may include: a group of electrical components 728; a substrate 732; a molded structure 736; a metal layer 740; a shield portion 744; an electrode 748; and a void 752. The shield portion 744 may be configured to inhibit electromagnetic interference within the circuit assembly 724 and the electronic device 704. The electrode 748 may be electrically coupled with the group of electrical components 728. The electrode 748 may be used to connect the circuit assembly 724 with another component and/or assembly of the electronic device 704 and/or define a sensing element configured to detect one or more inputs associated with the electronic device 704.

Figure 8:
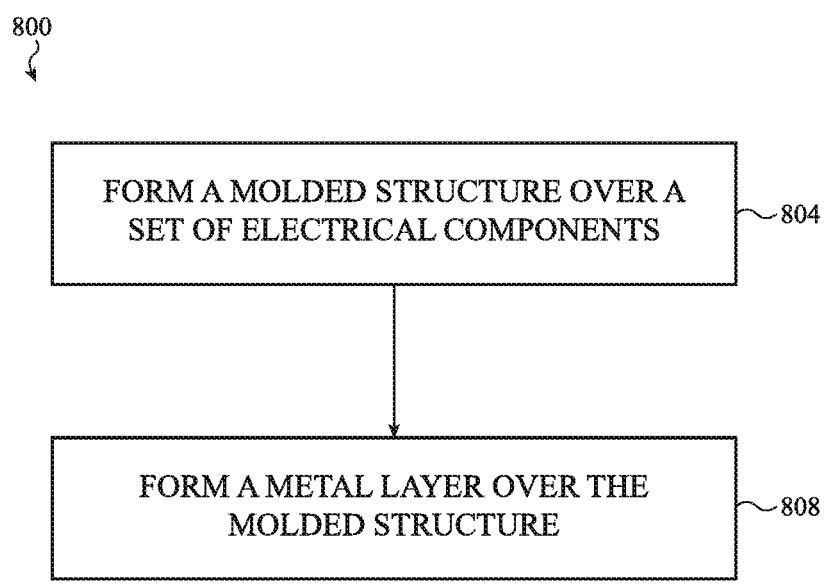
FIG. 8 is a flow diagram of a method of forming a circuit assembly.

To facilitate the reader's understanding of the various functionalities of the embodiments discussed herein, reference is now made to the flow diagram in FIG. 8, which illustrates process 800. While specific steps (and orders of steps) of the methods presented herein have been illustrated and will be discussed, other methods (including more, fewer, or different steps than those illustrated) consistent with the teachings presented herein are also envisioned and encompassed with the present disclosure.

In this regard, with reference to FIG. 8, process 800 relates generally to forming a circuit assembly. The process 800 may be used to form or manufacture any of the circuit assemblies described herein, for example, such as circuit assembly 124, 624, and 724, and variations and embodiments thereof.

At operation 804, a molded structure may be formed over a group of electrical components positioned along a printed circuit board. The molded structure may fully or partially encapsulate the group of electrical components. For example and with reference to FIGS. 2-3A, the molded structure 136 may be formed over the group of electrical components 128. The group of electrical components 128 may be positioned along the substrate 132. As such, the molded structure 136 may be formed over and partially or fully encapsulate the group of electrical components 128 and the substrate 132.

As described above with respect to FIG. 2, the molded structure 136 may be formed using a variety of techniques and appropriate materials. For example, the molded structure 136 may be formed from a moldable or castable material, including injection moldable plastics, ceramics, synthetics, composites, and so on. Accordingly, the molded structure 136 may be formed by flowing a substantially liquefied or viscous material over one or more surfaces of the circuit assembly 124. For example, material may be introduced into a form containing the group of electrical components 128 and/or the substrate 132 and caused to harden or solidify around one or more surfaces of the group of electrical components 128 and/or the substrate 132. This may allow the molded structure 136 to encapsulate the group of electrical components 128 on the surface of the substrate 132. In some cases, the molded material may be subsequently cured or hardened, including undergoing a heat or chemical treatment to cool and/or solidify the molded material around the group of electrical components 128 and/or the substrate 132.

At operation 808, a metal layer may be formed over a region of the molded structure. The metal layer may define an electrode electrically coupled with the group of electrical components. For example and with reference to FIGS. 2-3A, the metal layer 140 may be formed over a region of the molded structure 136. This may be accomplished by a sputtering or other physical vapor deposition technique, as described herein. The metal layer 140 may define the shield portion 144 and the electrode 148, which may be separated from one another along the molded structure 136 by a void 152. The electrode 148 may be electrically coupled with the group of electrical components 128. The shield portion 144 may be configured to inhibit electromagnetic signals.

As described above with respect to FIG. 2, the metal layer 140 (including the shield portion 144 and the electrode 148) may be formed and/or positioned along the molded structure 136 using a variety of techniques and various materials. For example, the shield portion 144 and the electrode 148 may be formed directly on or along a surface of the molded structure 136 opposite the substrate 132 by a deposition technique, including a sputter deposition or other physical vapor deposition process or technique. As such, a masking layer may be used to define the voids 152 separating the shield portion 144 and the electrode 148; however, this is not required. The voids 152 may be etched or excavated as needed to define the various features. Printing, coating, or plating may also be appropriate to apply the metal layer 140. Additionally or alternatively, as described above, the molded structure 136 may be formed from a metal-doped plastic material. As such, in some embodiments, the metal layer 140 may be formed from the metal-doped plastic material of the molded structure 136 by using a laser direct structuring (LDS) technique. In other cases, the metal layer 140 may be a separate substrate, film, sheet, or other layer applied to a target surface or region of the molded structure 136. In other cases, other techniques are possible.

Figure 9:
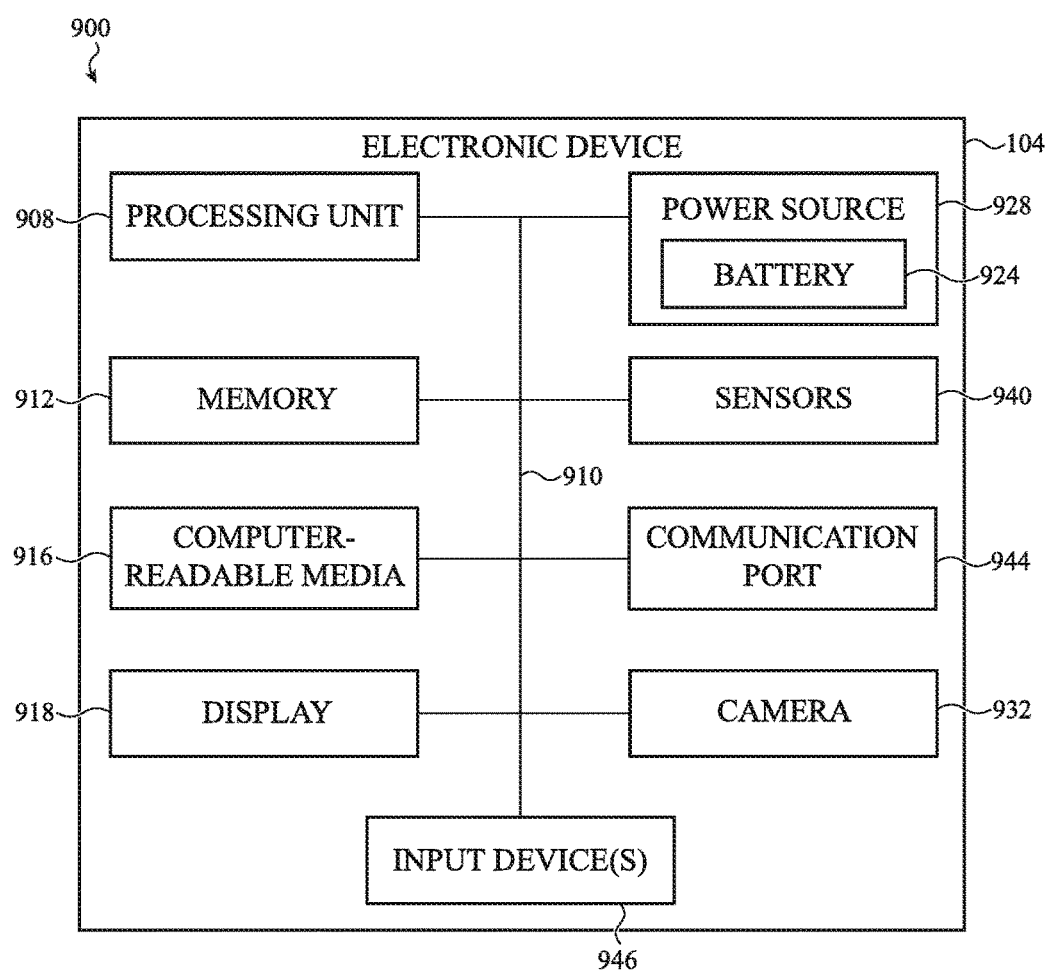
FIG. 9 illustrates a functional block diagram of an electronic device.

FIG. 9 presents a functional block diagram 900 of a sample electronic device, such as the electronic device 104 described with respect to FIGS. 1-5D. It will be appreciated, however, that the functional block diagram described herein of electronic device 104 may include components substantially analogous to components of other electronic devices or the like described herein. In this regard, the schematic representation in FIG. 9 may correspond to the electronic device depicted in FIGS. 1-5D, described above. However, the schematic representation in FIG. 9 may also correspond to the other electronic devices or the like described herein, for example, such as electronic devices 604 and 704 described with respect to FIGS. 6A-7B. The electronic device 104 may include any appropriate hardware (e.g., computing devices, data centers, switches), software (e.g., applications, system programs, engines), network components (e.g., communication paths, interfaces, routers) and the like (not necessarily shown in the interest of clarity) for use in facilitating any appropriate operations disclosed herein.

As shown in FIG. 9, the electronic device 104 may include a processing unit 908 operatively connected to computer memory 912 and computer-readable media 916. The processing unit 908 may be operatively connected to the computer memory 912 and computer-readable media 916 components via an electronic bus or bridge (e.g., such as system bus 910). The processing unit 908 may include one or more computer processors or microcontrollers that are configured to perform operations in response to computer-readable instructions. The processing unit 908 may be a central processing unit of the electronic device 104. Additionally or alternatively, the processing unit 908 may be other processors within the device including application specific integrated chips (ASIC) and other microcontroller devices.

The computer memory 912 may include a variety of types of non-transitory computer-readable storage media, including, for example, read access memory (RAM), read-only memory (ROM), erasable programmable memory (e.g., EPROM and EEPROM), or flash memory. The memory 912 is configured to store computer-readable instructions, sensor values, and other persistent software elements. Computer-readable media 916 may also include a variety of types of non-transitory computer-readable storage media including, for example, a hard-drive storage device, a solid state storage device, a portable magnetic storage device, or other similar device. The computer-readable media 916 may also be configured to store computer-readable instructions, sensor values, and other persistent software elements.

In this example, the processing unit 908 is operable to read computer-readable instructions stored on the computer memory 912 and/or computer-readable media 916. The computer-readable instructions may adapt the processing unit 908 to perform the operations or functions described above with respect to FIGS. 1A-12C. The computer-readable instructions may be provided as a computer-program product, software application, or the like. It should be appreciated that, where the electronic device 104 is a stylus, the processing unit 908 may be located in an electronic device associated with the stylus, rather than the stylus itself. In such embodiments, data may be transmitted from the stylus to and from the electronic device, such that the processing unit in the electronic device may operatively control the stylus.

As shown in FIG. 9, the electronic device 104 may also include a display 918. The display 918 may include a liquid-crystal display (LCD), organic light emitting diode (OLED) display, light emitting diode (LED) display, or the like. If the display 918 is an LCD, the display may also include a backlight component that can be controlled to provide variable levels of display brightness. If the display 918 is an OLED or LED type display, the brightness of the display 918 may be controlled by modifying the electrical signals that are provided to display elements.

The electronic device 104 may also include a battery 924 that is configured to provide electrical power to the components of the electronic device 104. The battery 924 may include one or more power storage cells that are linked together to provide an internal supply of electrical power. In this regard, the battery 924 may be a component of a power source 928 (e.g., including a charging system or other circuitry that supplies electrical power to components of the electronic device 104). The battery 924 may be operatively coupled to power management circuitry that is configured to provide appropriate voltage and power levels for individual components or groups of components within the electronic device 104. The battery 924, via power management circuitry, may be configured to receive power from an external source, such as an AC power outlet or interconnected computing device. The battery 924 may store received power so that the electronic device 104 may operate without connection to an external power source for an extended period of time, which may range from several hours to several days.

The electronic device 104 may also include one or more sensors 940 that may be used to detect a touch and/or force input, environmental condition, orientation, position, or some other aspect of the electronic device 104. Example sensors 940 that may be included in the electronic device 104 may include, without limitation, one or more accelerometers, gyrometers, inclinometers, goniometers, or magnetometers. The sensors 940 may also include one or more proximity sensors, such as a magnetic hall-effect sensor, inductive sensor, capacitive sensor, continuity sensor, or the like. In some implementations, one or more of the sensors 940 may include or be configured to operate in conjunction with an electrode of a metal layer of a circuit assembly, as described herein. For example, an electrode of the metal layer may for a sensing element for a touch and/or force sensor that is configured to detect an input along a surface of the device 104.

The sensors 940 may also be broadly defined to include wireless positioning devices including, without limitation, global positioning system (GPS) circuitry, Wi-Fi circuitry, cellular communication circuitry, and the like. The electronic device 104 may also include one or more optical sensors including, without limitation, photodetectors, photosensors, image sensors, infrared sensors, or the like. In one example, the sensor 940 may be an image sensor that detects a degree to which an ambient image matches a stored image. As such, the sensor 940 may be used to identify a user of the electronic device 104. The sensors 940 may also include one or more acoustic elements, such as a microphone used alone or in combination with a speaker element. The sensors 940 may also include a temperature sensor, barometer, pressure sensor, altimeter, moisture sensor or other similar environmental sensor. The sensors 940 may also include a light sensor that detects an ambient light condition of the electronic device 104.

The sensor 940, either alone or in combination, may generally be a motion sensor that is configured to determine an orientation, position, and/or movement of the electronic device 104. For example, the sensor 940 may include one or more motion sensors including, for example, one or more accelerometers, gyrometers, magnetometers, optical sensors, or the like to detect motion. The sensors 940 may also be configured to determine one or more environmental conditions, such as temperature, air pressure, humidity, and so on. The sensors 940, either alone or in combination with other input, may be configured to estimate a property of a supporting surface including, without limitation, a material property, surface property, friction property, or the like.

The electronic device 104 may also include a camera 932 that is configured to capture a digital image or other optical data. The camera 932 may include a charge-coupled device, complementary metal oxide (CMOS) device, or other device configured to convert light into electrical signals. The camera 932 may also include one or more light sources, such as a strobe, flash, or other light-emitting device. As discussed above, the camera 932 may be generally categorized as a sensor for detecting optical conditions and/or objects in the proximity of the electronic device 104. However, the camera 932 may also be used to create photorealistic images that may be stored in an electronic format, such as JPG, GIF, TIFF, PNG, raw image file, or other similar file types.

The electronic device 104 may also include a communication port 944 that is configured to transmit and/or receive signals or electrical communication from an external or separate device. The communication port 944 may be configured to couple to an external device via a cable, adaptor, or other type of electrical connector. In some embodiments, the communication port 944 may be used to couple the electronic device 104 with a computing device and/or other appropriate accessories configured to send and/or receive electrical signals. The communication port 944 may be configured to receive identifying information from an external accessory, which may be used to determine a mounting or support configuration. For example, the communication port 944 may be used to determine that the electronic device 104 is coupled to a mounting accessory, such as a particular type of stand or support structure.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A circuit assembly for an electronic device, comprising:
    a printed circuit board;
    a group of electrical components attached to a surface of the printed circuit board;
    a molded structure encapsulating the group of electrical components and at least a portion of the surface of the printed circuit board; and
    a metal layer formed over an outer surface of the molded structure and defining:
        a shield portion configured to provide shielding for one or more of the group of electrical components; and
        an electrode electrically isolated from the shield portion and configured to detect an input applied to the electronic device.

2. The circuit assembly of claim 1, wherein the electrode forms a capacitive sensing element that is configured to detect a touch applied to the electronic device.

3. The circuit assembly of claim 1, wherein:
    the electronic device comprises a sensing layer that is electrically coupled to the electrode of the circuit assembly; and
    the input comprises a force applied to the electronic device; and
    a capacitance between the sensing layer and the electrode changes in response to the force applied to the electronic device.

4. The circuit assembly of claim 1, wherein:
    the shield portion and the electrode are formed from a common material; and
    the shield portion and the electrode are arranged substantially coplanar along the outer surface of the molded structure.

5. The circuit assembly of claim 1, wherein:
    the electrode is a first electrode;
    the metal layer defines a second electrode separated from the shield portion;
    the first electrode and the second electrode are separated from the shield portion by a gap; and
    the circuit assembly further comprises an electrical trace extending between the first electrode and the second electrode and positioned within the gap.

6. The circuit assembly of claim 5, wherein:
    the molded structure is formed from a plastic doped with a metal material; and
    the electrical trace is formed along the outer surface of the molded structure from a portion of the metal material remaining after a portion of the plastic has been ablated.

7. The circuit assembly of claim 1, further comprising:
    electrically conductive vias extending through the molded structure electrically coupling the electrode with one or more electrical components of the group of electrical components.

8. The circuit assembly of claim 1, wherein:
    the surface of the printed circuit board is a first surface;
    the printed circuit board further defines a second surface opposite the first surface;
    the molded structure is a first molded structure formed at least partially over the first surface; and
    a second molded structure is formed at least partially over the second surface.

9. The circuit assembly of claim 1, wherein:
    the circuit assembly further comprises a flexible circuit; and
    the flexible circuit is electrically coupled to the metal layer at a first end and electrically coupled to an element of the printed circuit board at a second end opposite to the first end.

10. A wearable electronic device, comprising:
    an enclosure; and
    a circuit assembly positioned within the enclosure and comprising:
        a printed circuit board;
        a group of electrical components attached and electrically coupled to the printed circuit board;
        a molded structure encapsulating the group of electrical components; and
        a metal layer formed over the molded structure and defining:
            an electromagnetic shield for one or more electrical components of the group of electrical components; and
            an electrode electrically isolated from the electromagnetic shield and configured to electrically couple to an electrical component of the wearable electronic device that is distinct from the circuit assembly.

11. The wearable electronic device of claim 10, wherein:
    the electrode forms a sensing element configured to detect an input received along an exterior surface of the wearable electronic device; and
    one or more of the group of electrical components are responsive to the detected input.

12. The wearable electronic device of claim 11, wherein:
    the enclosure defines an opening;
    the wearable electronic device further comprises a touch sensitive display at least partially positioned within the opening and configured to depict a graphical output of the wearable electronic device;
    the electrical component of the wearable electronic device is a sensing layer of the touch sensitive display; and
    the graphical output is responsive to the detected input.

13. The wearable electronic device of claim 12, wherein:
    the sensing layer moves inward toward the circuit assembly in response to receiving the input; and
    the movement of the sensing layer results in a change in capacitance between the sensing layer and the electrode.

14. The wearable electronic device of claim 10, wherein the electrode defines a contact pad that is directly coupled with the electrical component of the electronic device.

15. The wearable electronic device of claim 10, wherein the electrical component of the wearable electronic device is an antenna configured to receive a wireless communication signal.

16. The wearable electronic device of claim 10, wherein:
the wearable electronic device comprises a band coupled to the enclosure and configured to secure the wearable electronic device to a user; and
the electrode is configured to detect when the wearable electronic device is secured to the user.

17. A method of forming a circuit assembly, comprising:
forming a molded structure over a group of electrical components positioned along a printed circuit board to encapsulate the group of electrical components within the molded structure; and
forming a metal layer along an outer surface of the molded structure to define:
  (1) an electrode electrically coupled to the group of electrical components, and
  (2) a shield portion electrically isolated from the electrode and configured to shield the group of electrical components from electromagnetic interference.

18. The method of claim 17, wherein forming the metal layer further comprises:
sputtering an electrically conductive material onto a surface of the molded structure.

19. The method of claim 17, wherein forming the metal layer further comprises forming an electrical trace to the electrode.

20. The method of claim 17, wherein:
forming the molded structure further comprises flowing a plastic doped with a metal material along one or more surfaces of the group of electrical components; and
forming the metal layer further comprises forming electrical traces along a gap between the electrode and the shield portion, the electrical traces generated by laser treating a portion of the plastic.

* * * * *